(12) United States Patent
Huang

(10) Patent No.: US 11,152,311 B1
(45) Date of Patent: Oct. 19, 2021

(54) SEMICONDUCTOR DEVICE WITH PROTECTION STRUCTURE AND AIR GAPS AND METHOD FOR FABRICATING THE SAME

(71) Applicant: NANYA TECHNOLOGY CORPORATION, New Taipei (TW)

(72) Inventor: Teng-Yen Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/854,566

(22) Filed: Apr. 21, 2020

(51) Int. Cl.
*H01L 23/552* (2006.01)
*H01L 23/00* (2006.01)

(52) U.S. Cl.
CPC ............ *H01L 23/552* (2013.01); *H01L 24/19* (2013.01); *H01L 24/20* (2013.01); *H01L 24/82* (2013.01)

(58) Field of Classification Search
CPC ....... H01L 23/552; H01L 24/19; H01L 24/20; H01L 24/82
USPC ......................................................... 257/659
See application file for complete search history.

(56) References Cited

U.S. PATENT DOCUMENTS

| | | | |
|---|---|---|---|
| 2003/0047728 A1* | 3/2003 | Chen | B82Y 10/00 257/10 |
| 2012/0013022 A1* | 1/2012 | Sabuncuoglu Tezcan | H01L 23/481 257/774 |
| 2017/0092631 A1* | 3/2017 | Standing | H01L 25/167 |
| 2018/0082951 A1* | 3/2018 | Li | H01L 23/53266 |

* cited by examiner

*Primary Examiner* — Didarul A Mazumder
(74) *Attorney, Agent, or Firm* — Muncy, Geissler, Olds and Lowe, P.C.

(57) ABSTRACT

The present application discloses a semiconductor device with a protection structure for suppressing electromagnetic interference and air gaps reducing parasitic capacitance and a method for fabricating the semiconductor device. The semiconductor device includes a connection structure including a connecting dielectric layer, a first protection structure positioned in the connecting dielectric layer and positioned adjacent to a perimeter of the connecting dielectric layer, and a plurality of air gaps positioned on sides of the first protection structure. The first protection structure is formed of copper, aluminum, titanium, tungsten, cobalt, the like, or a combination thereof.

4 Claims, 27 Drawing Sheets

SEMICONDUCTOR DEVICE WITH PROTECTION STRUCTURE AND AIR GAPS AND METHOD FOR FABRICATING THE SAME

TECHNICAL FIELD

The present disclosure relates to a semiconductor device and a method for fabricating the semiconductor device, and more particularly, to a semiconductor device with a protection structure for suppressing electromagnetic interference and air gaps reducing parasitic capacitance and a method for fabricating the semiconductor device with the protection structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a connection structure including a connecting dielectric layer, a first protection structure positioned in the connecting dielectric layer and positioned adjacent to a perimeter of the connecting dielectric layer, and a plurality of air gaps positioned on sides of the first protection structure. The first protection structure is formed of copper, aluminum, titanium, tungsten, cobalt, the like, or a combination thereof.

In some embodiments, a top surface of the first protection structure and a top surface of the connecting dielectric layer are substantially coplanar. A bottom surface of the first protection structure and a bottom surface of the connecting dielectric layer are substantially coplanar.

In some embodiments, the semiconductor device includes a capping layer positioned on the connecting dielectric layer and on the first protection structure. The capping layer seals the plurality of air gaps.

In some embodiments, the semiconductor device includes a first semiconductor die and a second semiconductor die. The first semiconductor die is positioned below the connecting dielectric layer. The second semiconductor die is positioned on the connecting dielectric layer and on the first protection structure. The second semiconductor die seals the plurality of air gaps.

In some embodiments, a top surface of the first protection structure and a top surface of the connecting dielectric layer are substantially coplanar. A thickness of the first protection structure is less than a thickness of the connecting dielectric layer.

In some embodiments, a thickness of the first protection structure is less than a thickness of the connecting dielectric layer.

In some embodiments, the semiconductor device includes a second protection structure positioned in the connecting dielectric layer and positioned adjacent to the first protection structure.

In some embodiments, the semiconductor device includes a plurality of dummy pads positioned in the second semiconductor die and positioned on the top surface of the first protection structure.

In some embodiments, a width of the plurality of dummy pads is greater than a width of the first protection structure.

In some embodiments, the semiconductor device includes a plurality of ferromagnetic spacers positioned between the first protection structure and the plurality of air gaps. The plurality of ferromagnetic spacers are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

In some embodiments, the semiconductor device includes a plurality of porous spacers positioned between the first protection structure and the plurality of air gaps. A porosity of the plurality of porous spacers is between about 20% and about 60%.

In some embodiments, the first protection structure includes a plurality of pad portions vertically arranged in the connecting dielectric layer. The plurality of pad portions are separate from each other.

In some embodiments, the semiconductor device includes a plurality of via portions positioned between adjacent pairs of the plurality of pad portions.

Another aspect of the present disclosure provides a method for fabricating a semiconductor device including providing a first semiconductor die, forming a connecting dielectric layer above the first semiconductor die, forming a first trench in the connecting dielectric layer, forming a plurality of sacrificial spacers on sides of the first trench, forming a first protection structure in the first trench, and performing an energy treatment to turn the plurality of sacrificial spacers into a plurality of air gaps. The plurality of sacrificial spacers are formed of an energy-removable material and the first protection structure is formed of copper, aluminum, titanium, tungsten, cobalt, the like, or a combination thereof.

In some embodiments, the energy-removable material is a thermal decomposable material, a photonic decomposable material, an e-beam decomposable material, or a combination thereof.

In some embodiments, an energy source of the energy treatment is heat, light, or a combination thereof.

In some embodiments, the method for fabricating the semiconductor device includes a step of forming a capping layer to seal the plurality of air gaps. The capping layer is formed of silicon oxide, fluorine-doped silicon oxide, or organic spin-on glass.

In some embodiments, the method for fabricating the semiconductor device includes a step of forming a second semiconductor die on the connecting dielectric layer and on the first protection structure through a bonding process. A temperature of the bonding process is between about 300° C. and about 450° C.

In some embodiments, the method for fabricating the semiconductor device includes a step of forming a plurality of ferromagnetic spacers on sides of the plurality of sacrificial spacers.

In some embodiments, the plurality of ferromagnetic spacers are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

Due to the design of the semiconductor device of the present disclosure, the first protection structure may suppress electromagnetic interference and the plurality of air gaps may reduce the parasitic capacitance of the first protection structure. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
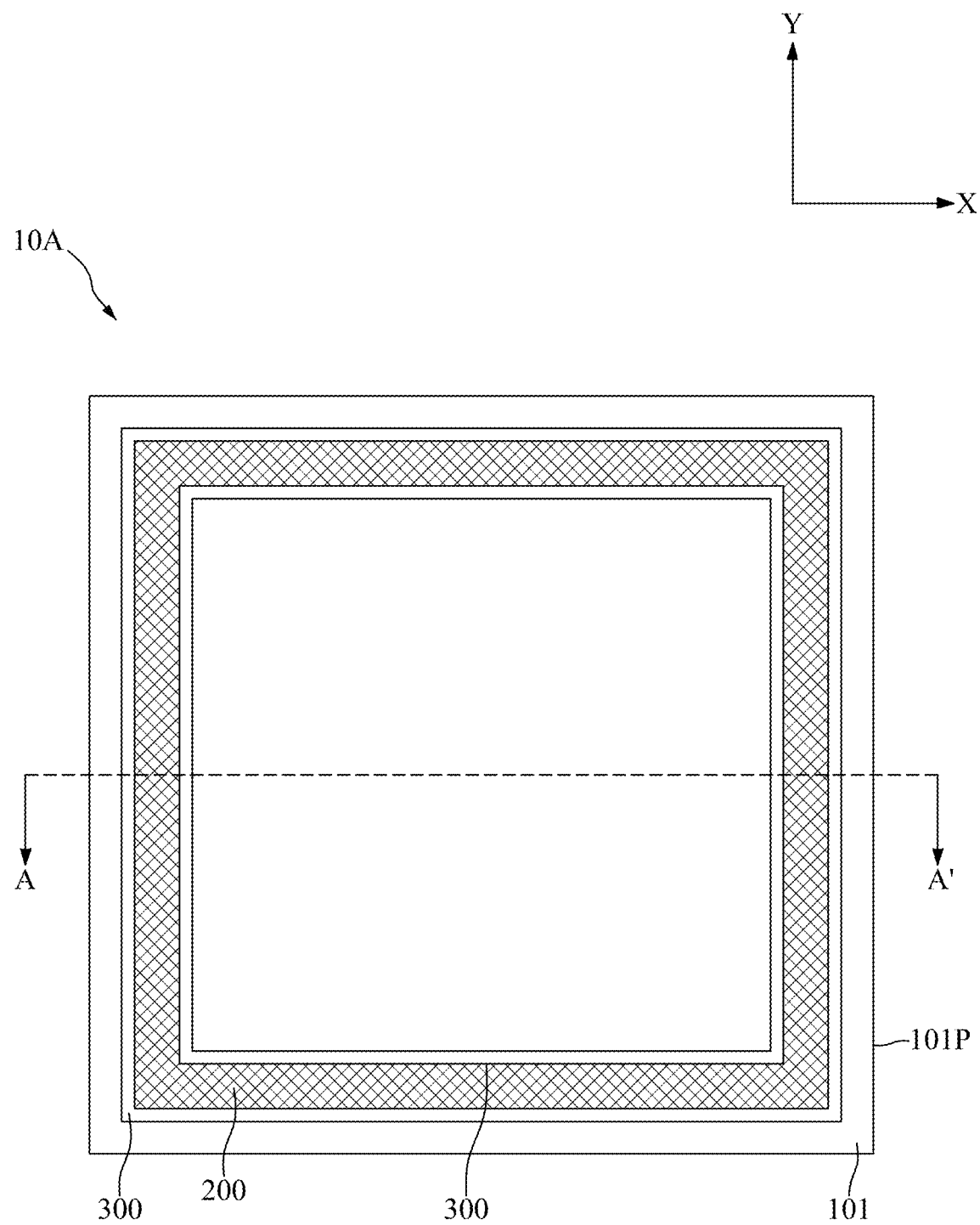
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 2:
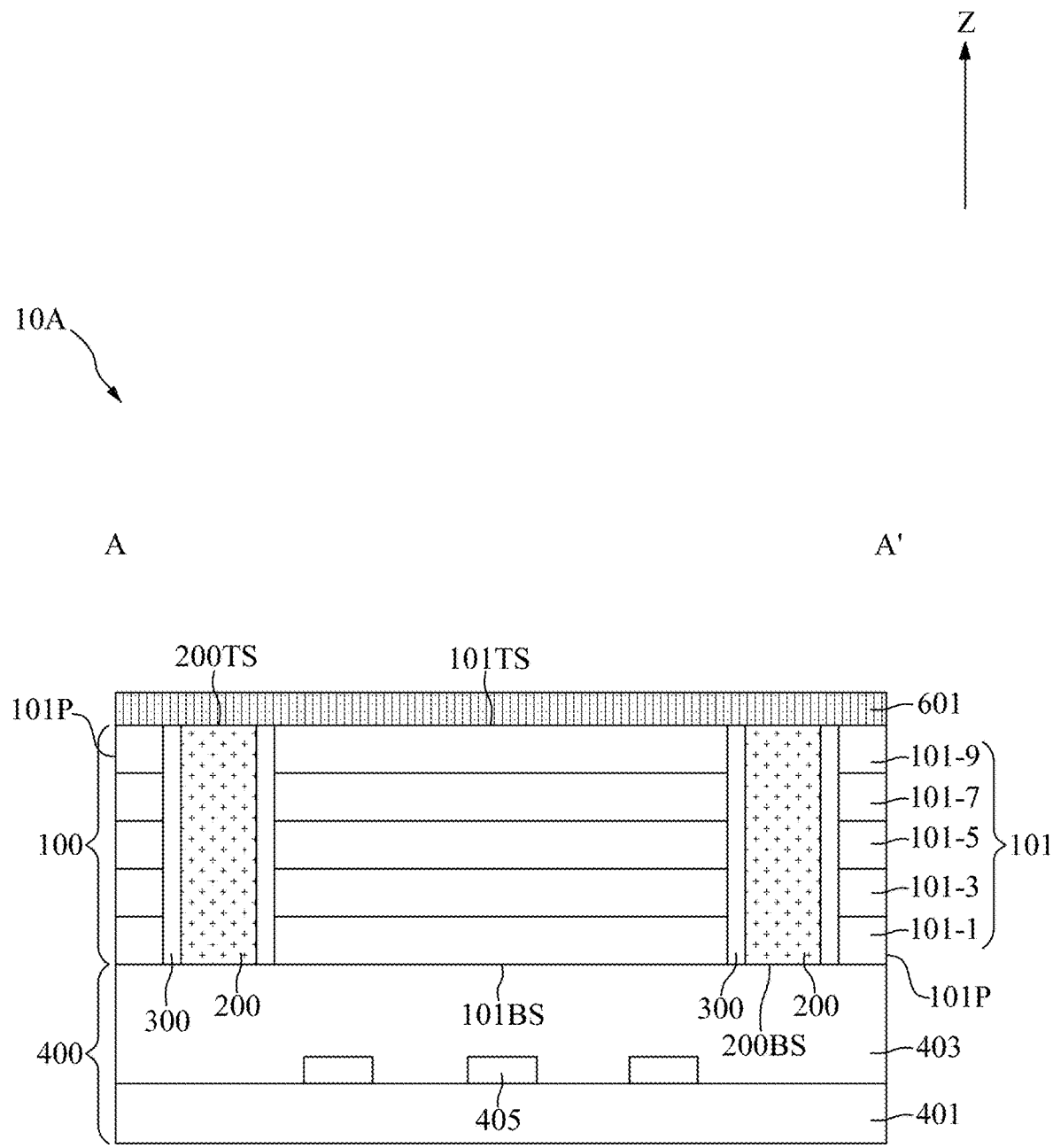
FIG. 2 is a schematic cross-sectional view diagram taken along a line A-A' in FIG. 1.

FIG. 1 illustrates, in a schematic top-view diagram, a semiconductor device in accordance with one embodiment of the present disclosure. FIG. 2 is a schematic cross-sectional view diagram taken along a line A-A' in FIG. 1.

With reference to FIG. 1, the semiconductor device 10A may include a connection structure 100, a first protection structure 200, a plurality of air gaps 300, and a capping layer 601.

With reference to FIGS. 1 and 2, the connection structure 100 may be disposed on the first semiconductor die 400. The connection structure 100 may include a connecting dielectric layer 101 and a plurality of connection conductive layers (Not shown in FIG. 2 for clarity). The connecting dielectric layer 101 may be disposed on the first semiconductor die 400. In some embodiments, the connecting dielectric layer 101 may be a stacked layer structure. The connecting dielectric layer 101 may include a plurality of sub-layers 101-1, 101-3, 101-5, 101-7, 101-9. The plurality of sub-layers 101-1, 101-3, 101-5, 101-7, 101-9 may be formed of, for example, silicon oxide, silicon nitride, borophosphosilicate glass, undoped silicate glass, fluorinated silicate glass, low-k dielectric materials, the like, or a combination thereof. The plurality of sub-layers 101-1, 101-3, 101-5, 101-7, 101-9 may be formed of different materials but are not limited thereto. The low-k dielectric materials may have a dielectric constant less than 3.0 or even less than 2.5. In some embodiments, the low-k dielectric materials may have a dielectric constant less than 2.0.

The top surface of the sub-layer 101-9 may be referred to as the top surface 101TS of the connecting dielectric layer 101. The bottom surface of the sub-layer 101-1 may be referred to as the bottom surface 101BS of the connecting dielectric layer 101.

The plurality of connection conductive layers may be disposed penetrating the connecting dielectric layer 101. The plurality of connection conductive layers may be electrically coupled to first conductive features (Not shown in FIG. 2 for clarity) in the first semiconductor die 400. The plurality of connection conductive layers may be formed of, for example, copper, aluminum, titanium, the like, or a combination thereof.

With reference to FIGS. 1 and 2, in a top-view perspective, the first protection structure 200 may be disposed adjacent to and parallel to a perimeter 101P of the connecting dielectric layer 101. In the embodiment depicted, the first protection structure 200 may have a square ring shape. In some embodiments, the first protection structure 200 may have an octagonal shape or other suitable shapes. In a cross-sectional perspective, the first protection structure 200 may be disposed in the connecting dielectric layer 101. In the embodiment depicted, the first protection structure 200 may be disposed penetrating the connecting dielectric layer 101. A top surface 200TS of the first protection structure 200 may be substantially coplanar with the top surface 101TS of the connecting dielectric layer 101. A bottom surface 200BS of the first protection structure 200 may be substantially coplanar with the bottom surface 101BS of the connecting dielectric layer 101. In other words, a thickness of the first protection structure 200 may be equal to a thickness of the connecting dielectric layer 101.

The first protection structure 200 may be formed of, for example, copper, aluminum, titanium, tungsten, cobalt, the like, or a combination thereof. The first protection structure 200 may be dummy patterns. It should be noted that, an element is "dummy" means the element is electrically insulated from all of the device elements. In addition, when the semiconductor device is in operation, no exterior voltage or current will apply to the element.

With reference to FIGS. 1 and 2, in the embodiment depicted, the plurality of air gaps 300 may be disposed on sides of the first protection structure 200. The plurality of air gaps 300 may be empty spaces surrounded by the first protection structure 200, the first semiconductor die 400, the connecting dielectric layer 101, and the capping layer 601. The empty spaces may be filled with air so that a dielectric constant of the empty spaces may be significantly low. Therefore, the plurality of air gaps 300 may significantly reduce the parasitic capacitance between the first protection structure 200 and other conductive features.

With reference to FIGS. 1 and 2, in the embodiment depicted, the first semiconductor die 400 may include a first substrate 401, a first dielectric layer 403, a plurality of first device elements 405, and a plurality of first conductive features.

With reference to FIG. 2, the first substrate 401 may be formed of, for example, silicon, silicon carbide, germanium silicon germanium, gallium arsenic, indium arsenide, indium, or other semiconductor materials including group III, group IV, and group V elements. In some embodiments, the first substrate 401 may include a silicon-on-insulator structure. For example, the first substrate 401 may include a buried oxide layer formed by using a process such as separation by implanted oxygen.

With reference to FIG. 2, the first dielectric layer 403 may be a stacked layer structure. The first dielectric layer 403 may include a plurality of first insulating sub-layers. Each of the plurality of first insulating sub-layers may have a thickness between about 0.5 micrometer and about 3.0 micrometer. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but are not limited thereto.

With reference to FIG. 2, the plurality of first device elements 405 may be disposed in a lower portion of the first dielectric layer 403. The plurality of first device elements 405 may be disposed on the first substrate 401. The plurality of first device elements 405 may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. In some embodiments, portions of the first device elements 405 may be disposed in the first substrate 401. For example, source/drain regions of a metal-oxide-semiconductor field effect transistor may be disposed in the first substrate 401. In some embodiments, the first device elements 405 may be electrically insulated from neighboring device elements by insulating structures such as shallow trench isolation.

The plurality of first conductive features may be disposed in the first dielectric layer 403. The plurality of first conductive features may include, for example, a plurality of first conductive lines, a plurality of first conductive vias, and a plurality of first conductive contacts. The first conductive via may connect adjacent conductive lines along the direction Z. The first conductive via may improve heat dissipation in the first dielectric layer 403 and provide structure support in the first dielectric layer 403. In some embodiments, the plurality of first device elements 405 may be interconnected through the plurality of first conductive features. In some embodiments, some of the plurality of first conductive features may include wider portions. The wider portions may be referred to as first conductive pads.

The plurality of first conductive features may be formed of, for example, copper, aluminum, titanium, the like, or a combination thereof. The plurality of first conductive features may be formed of different materials but are limited thereto. The plurality of first conductive features may be electrically coupled to the plurality of connection conductive layers of the connection structure 100.

With reference to FIG. 2, the capping layer 601 may be disposed on the connecting dielectric layer 101 and on the first protection structure 200 and sealing the plurality of air gaps 300. The capping layer 601 may be a non-gap filling material such as silicon oxide formed using tetraethoxysilane (TEOS), fluorine-doped silicon oxide formed using fluorinated-TEOS, organic spin-on glass, or the like.

FIGS. 3 to 13 illustrate, in schematic cross-sectional diagrams, semiconductor devices 10B, 10C, 10D, 10E, 10F, 10G, 10H, 10I, 10J, 10K, and 10L in accordance with embodiments of the present disclosure.

Figure 3:
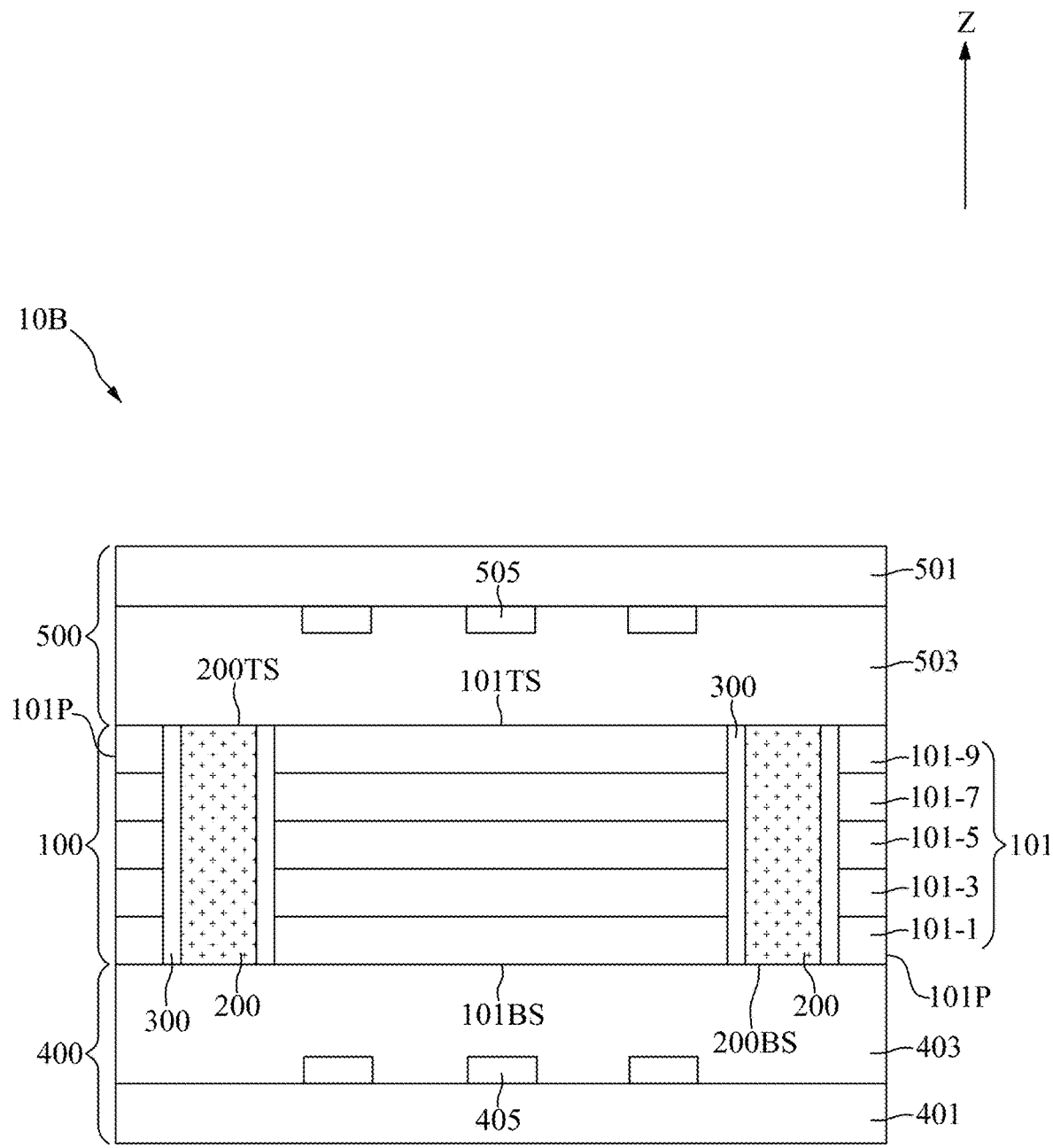
FIGS. 3 to 13 illustrate, in schematic cross-sectional diagrams, semiconductor devices in accordance with embodiments of the present disclosure.

With reference to FIG. 3, in the semiconductor device 10B, a second semiconductor die 500 may be disposed on the connecting dielectric layer 101 and on the first protection structure 200. The second semiconductor die 500 may seal the plurality of air gaps 300 instead of the capping layer 601. In some embodiments, the second semiconductor die 500 may have a structure similar with the first semiconductor die 400 and may include corresponding elements such as the second substrate 501, the second dielectric layer 503, the second device elements 505, and the plurality of second conductive features (Not shown in FIG. 3 for clarity). The first semiconductor die 400 and the second semiconductor die 500 may provide different functionalities. For example, the first semiconductor die 400 may provide a logic function and the second semiconductor die 500 may provide a memory function. In some embodiments, the first semiconductor die 400 and the second semiconductor die 500 may provide the same functionality.

With reference to FIG. 3, in the embodiment depicted, the second semiconductor die 500 may be disposed on the connecting dielectric layer 101 in an upside-down manner (or "face-to-back" manner) which means that the second dielectric layer 503 of the second semiconductor die 500 is disposed on the connection structure 100 and the second substrate 501 is disposed on the second dielectric layer 503. In some embodiments, the second semiconductor die 500 may be disposed on the connection structure 100 in a "back-to-face" manner, which means that the second substrate 501 is disposed on the connecting dielectric layer 101 and the second dielectric layer 503 is disposed on the second dielectric layer 503.

Figure 4:
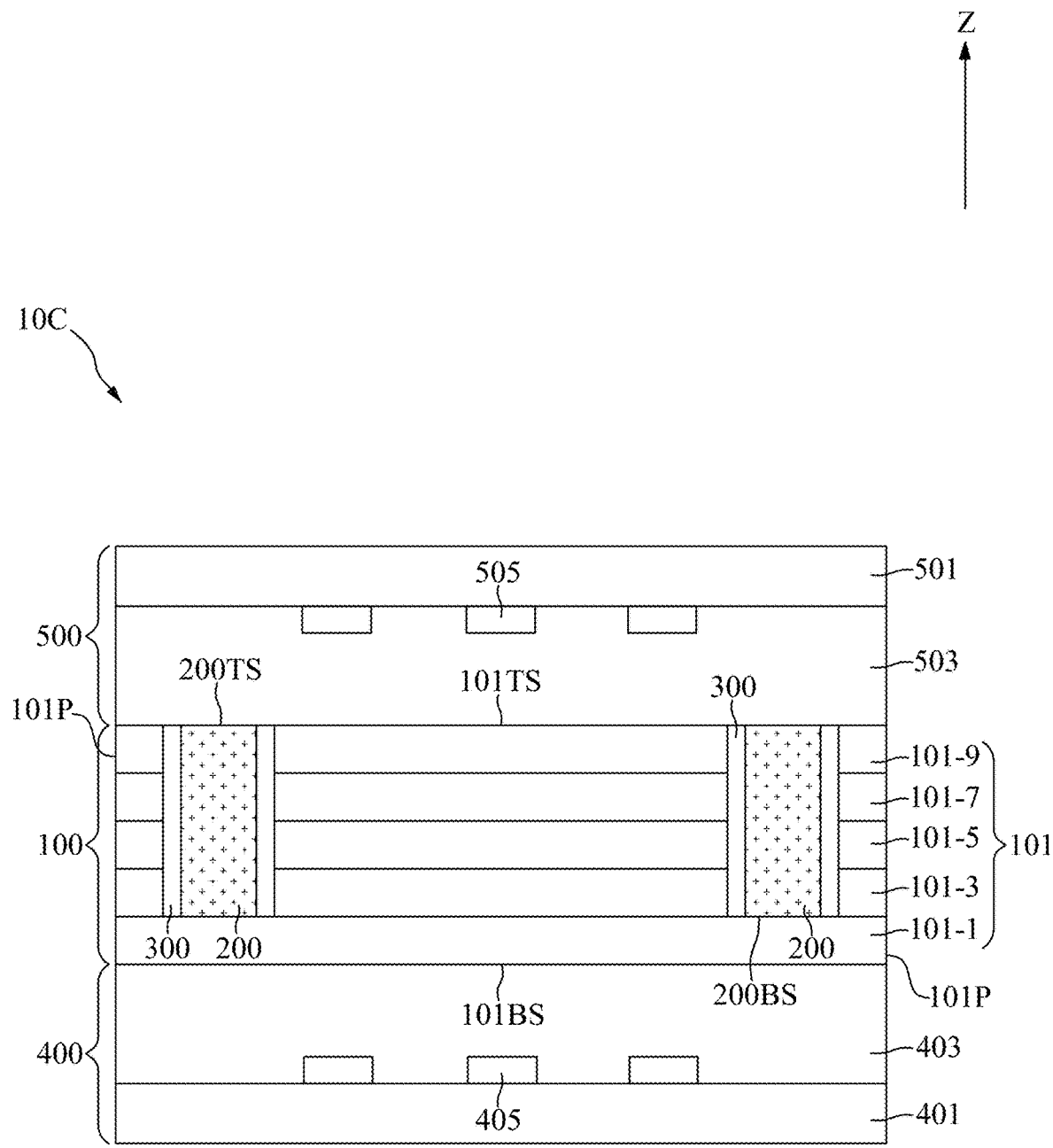

With reference to FIG. 4, in the semiconductor device 10C, the thickness of the first protection structure 200 may be less than the thickness of the connecting dielectric layer 101. In some embodiments, the top surface 200TS of the first protection structure 200 may be substantially coplanar with the top surface 101TS of the connecting dielectric layer 101. The bottom surface 200BS of the first protection structure 200 may be located at a vertical level higher than a vertical level of the bottom surface 101BS of the connecting dielectric layer 101. In some embodiments, the bottom surface 200BS of the first protection structure 200 may be substantially coplanar with the bottom surface 101BS of the connecting dielectric layer 101. The top surface 200TS of the first protection structure 200 may be located at a vertical level lower than a vertical level of the top surface 101TS of the connecting dielectric layer 101.

Figure 5:
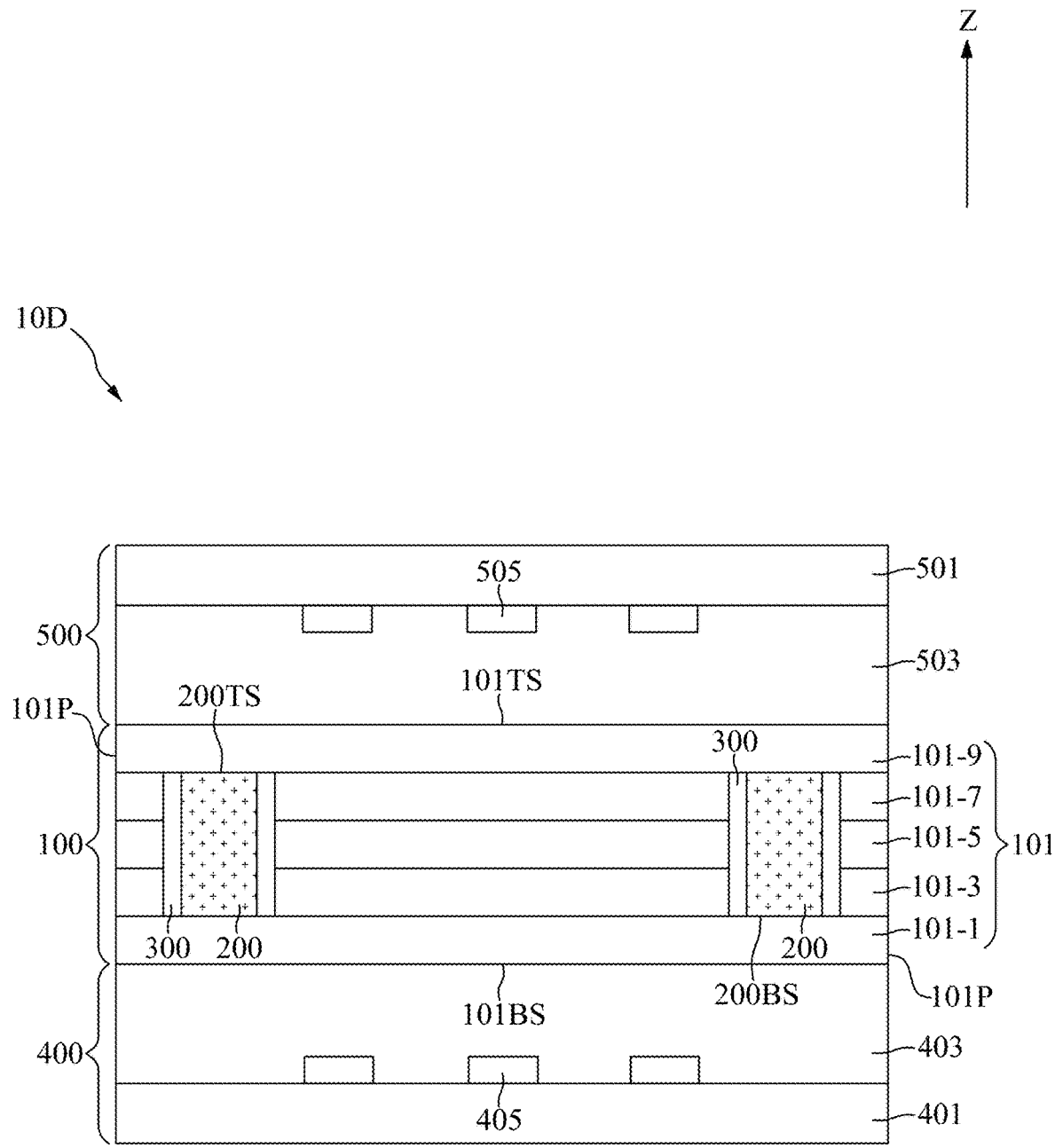

With reference to FIG. 5, in the semiconductor device 10D, the thickness of the first protection structure 200 may be less than the thickness of the connecting dielectric layer 101. In some embodiments, the top surface 200TS of the first protection structure 200 may be located at a vertical level lower than a vertical level of the top surface 101TS of the connecting dielectric layer 101. The bottom surface 200BS of the first protection structure 200 may be located at a vertical level higher than a vertical level of the bottom surface 101BS of the connecting dielectric layer 101.

Figure 6:
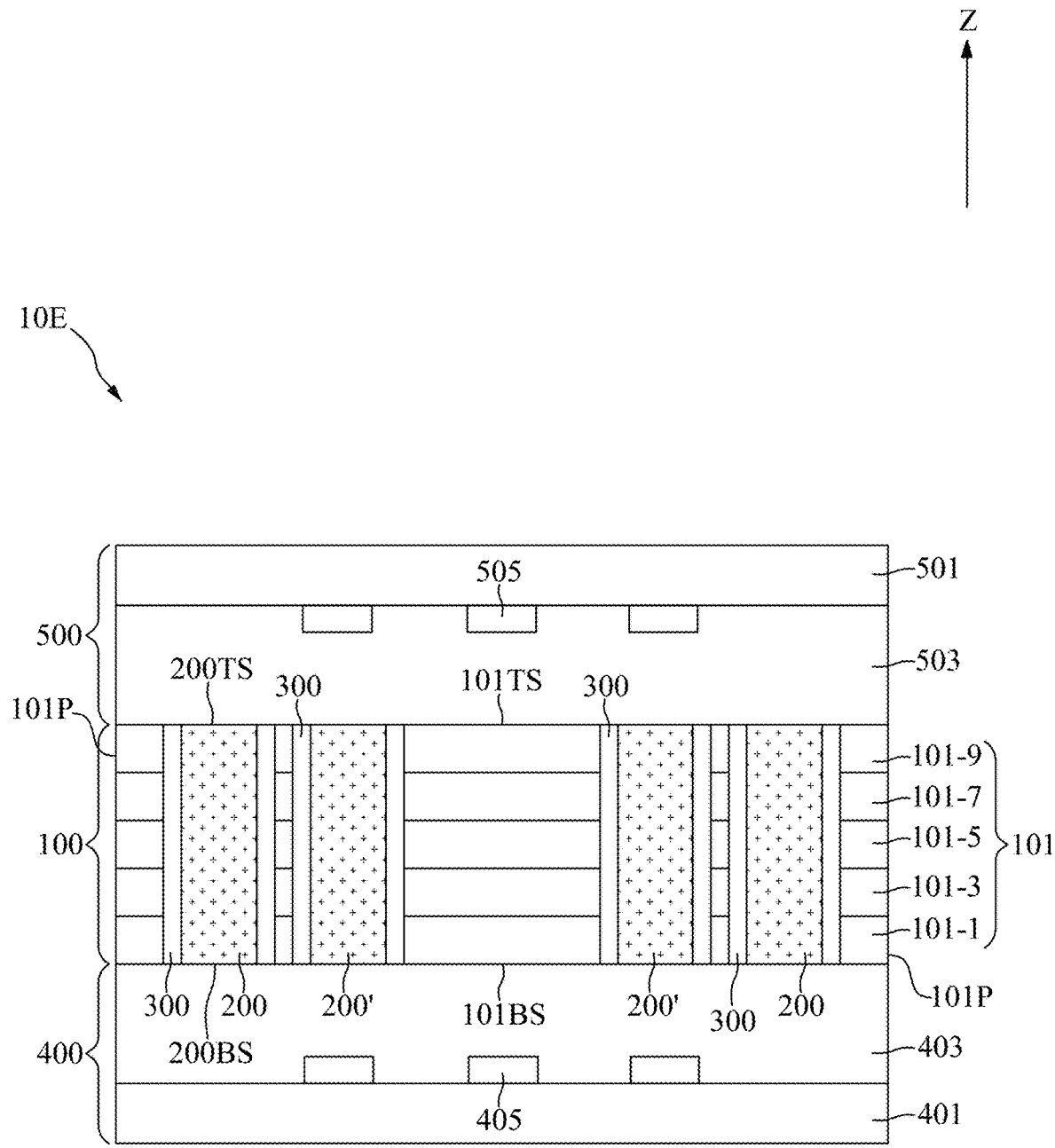

With reference to FIG. 6, in the semiconductor device 10E, a second protection structure 200' may be disposed adjacent to and parallel to the first protection structure 200. The second protection structure 200' may be disposed in the connecting dielectric layer 101. In some embodiments, the second protection structure 200' may have a same thickness as the connecting dielectric layer 101. In some embodiments, the second protection structure 200' may have a thickness less than that of the connecting dielectric layer 101. The plurality of air gaps 300 may also be disposed on sides of the second protection structure 200'. In some embodiments, the plurality of air gaps 300 may only disposed on the sides of the first protection structure 200.

Figure 7:
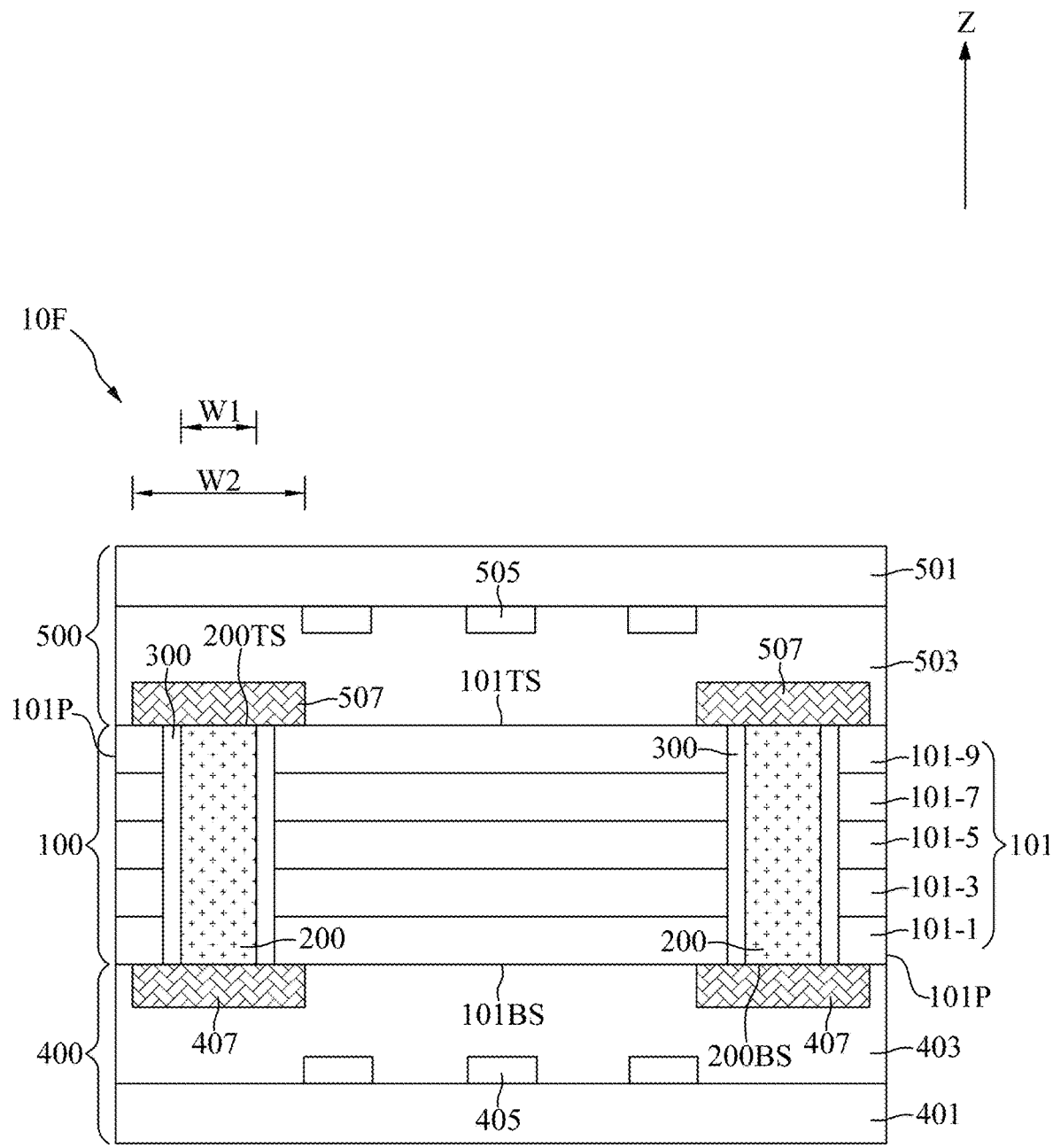

With reference to FIG. 7, in the semiconductor device 10F, a plurality of first dummy pads 407 may be disposed in the first dielectric layer 403. The first dummy pads 407 may contact the bottom surface 200BS of the first protection structure 200. A Width W2 of the plurality of first dummy pads 407 may be greater than a width W1 of the first protection structure 200. A plurality of second dummy pads 507 may be disposed in the second dielectric layer 503. The second dummy pads 507 may contact the top surface 200Ts of the first protection structure 200. A width W2 of the plurality of second dummy pads 507 may be greater than the width W1 of the first protection structure 200. The first dummy pads 407 and the second dummy pads 507 may be formed of, for example, copper, aluminum, titanium, tungsten, cobalt, the like, or a combination thereof. The contact between the plurality of first dummy pads 407 and the first protection structure 200 may facilitate a bonding process between the first semiconductor die 400 and the connection structure 100. The contact between the plurality of second dummy pads 507 and the first protection structure 200 may facilitate a bonding process between the second semiconductor die 500 and the connection structure 100.

Figure 8:
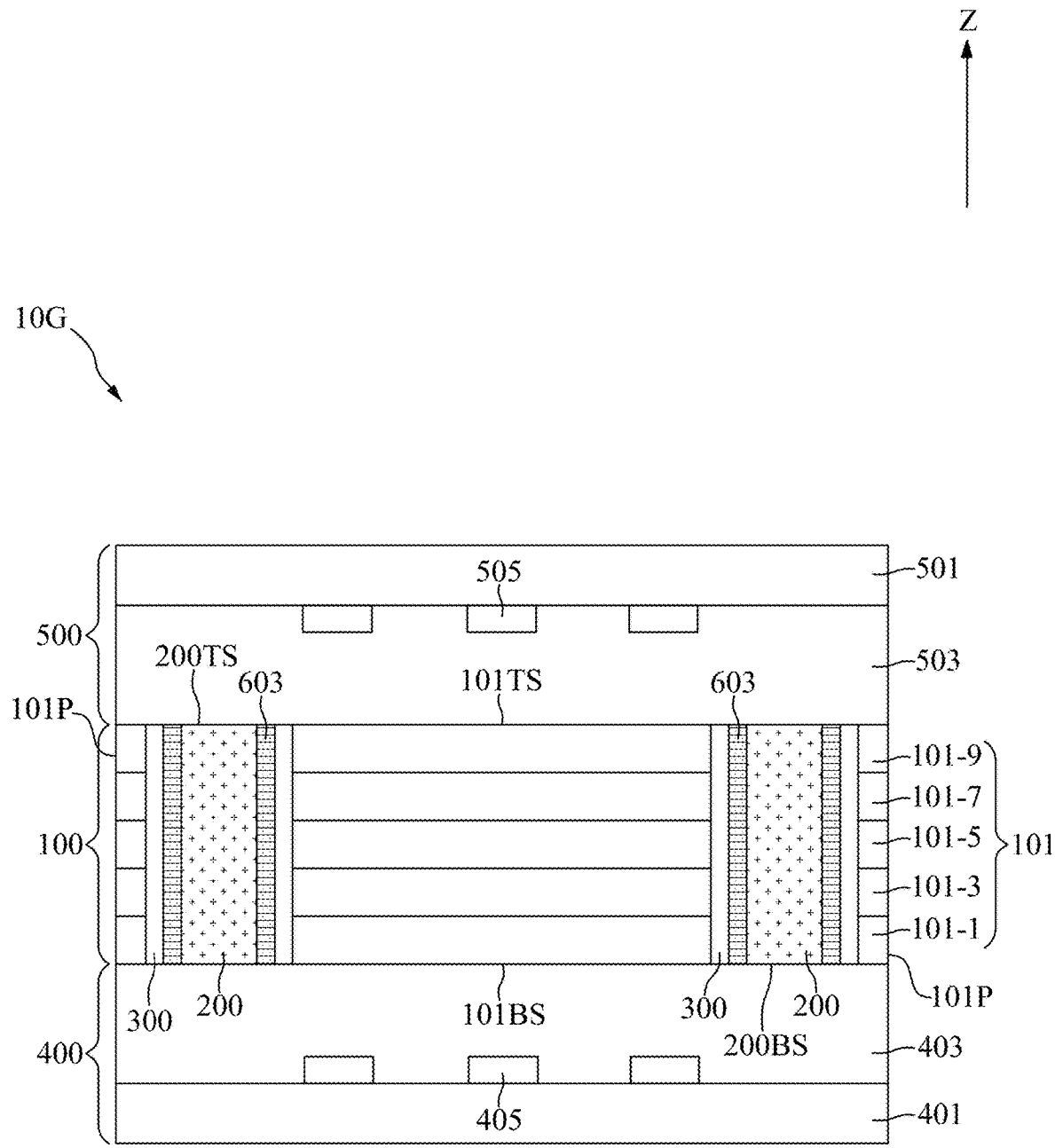

With reference to FIG. 8, in the semiconductor device 10G, a plurality of ferromagnetic spacers 603 may be disposed between the plurality of air gaps 300 and the first protection structure 200. In other words, the plurality of ferromagnetic spacers 603 may be disposed on sides of the first protection structure 200 and the plurality of air gaps 300 may be disposed on sides of the plurality of ferromagnetic spacers 603. The plurality of ferromagnetic spacers 603 may be formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet. The impedance of the plurality of ferromagnetic spacers 603 may be frequency sensitive. The high frequency energy, which may be the main composition of electromagnetic interference (or radio-frequency interference), may couple with the plurality of ferromagnetic spacers 603 and the impedance of the plurality of ferromagnetic spacers 603 may be developed. The impedance of plurality of ferromagnetic spacers 603 may dissipate the high frequency energy; therefore, the electromagnetic interference may be reduced.

Figure 9:
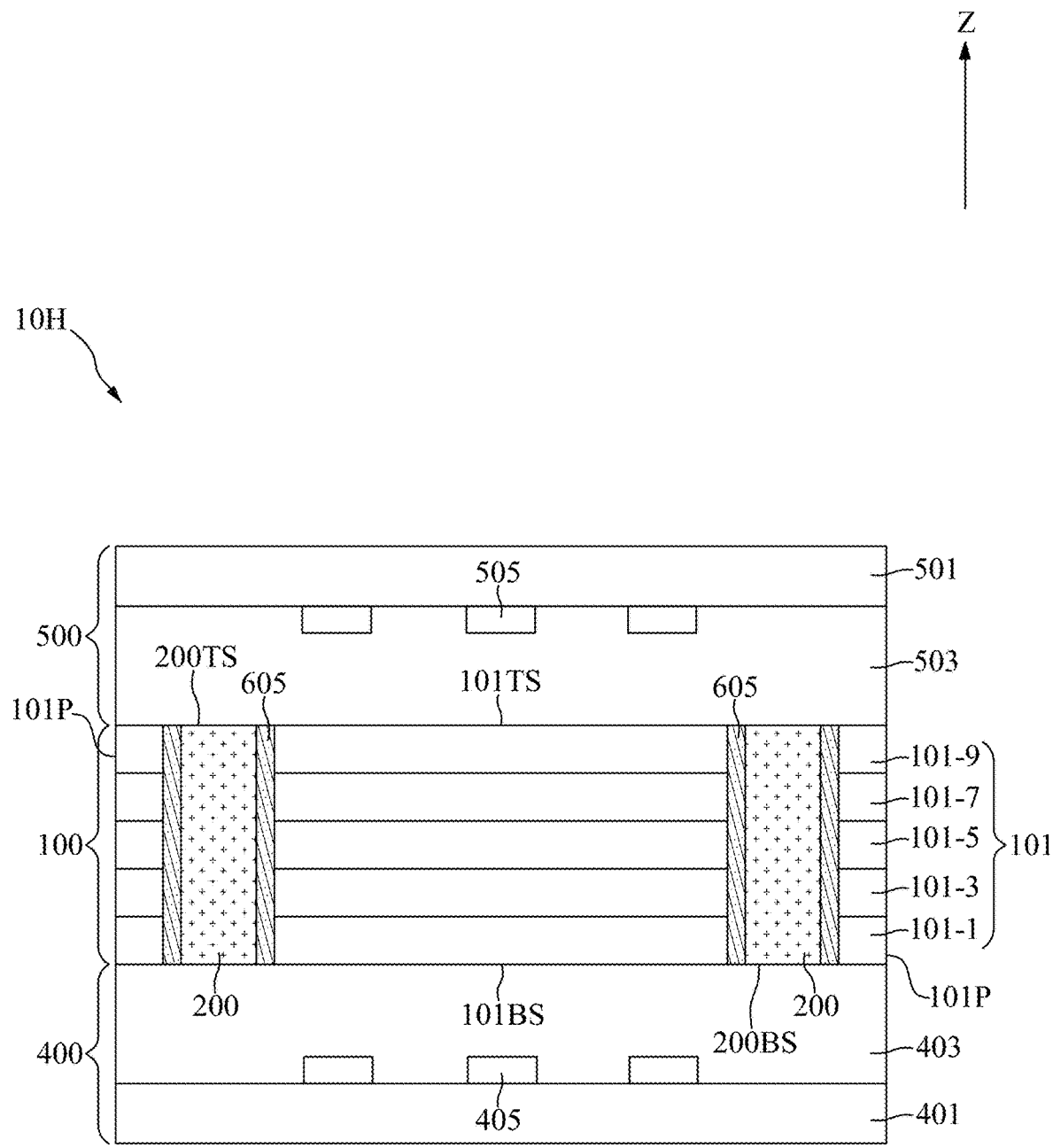

With reference to FIG. 9, in the semiconductor device 10H, a plurality of porous spacers 605 may be disposed on the sides of the first protection structure 200 instead of the plurality of air gaps 300. In some embodiments, a porosity of the plurality of porous spacers 605 may be between about 20% and about 60% and a dielectric constant of the plurality of porous spacers 605 may be lower than about 2.0.

The plurality of porous spacers 605 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the plurality of porous spacers 605 may be filled with air. As a result, a dielectric constant of the plurality of porous spacers 605 may be significantly lower than a layer formed of, for example, silicon oxide. Therefore, the plurality of porous spacers 605 may significantly reduce the parasitic capacitance of the first protection structure 200. The plurality of porous spacers 605 may provide structural support for the first protection structure 200 and keep alleviating the parasitic capacitance of the first protection structure 200.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

Figure 10:
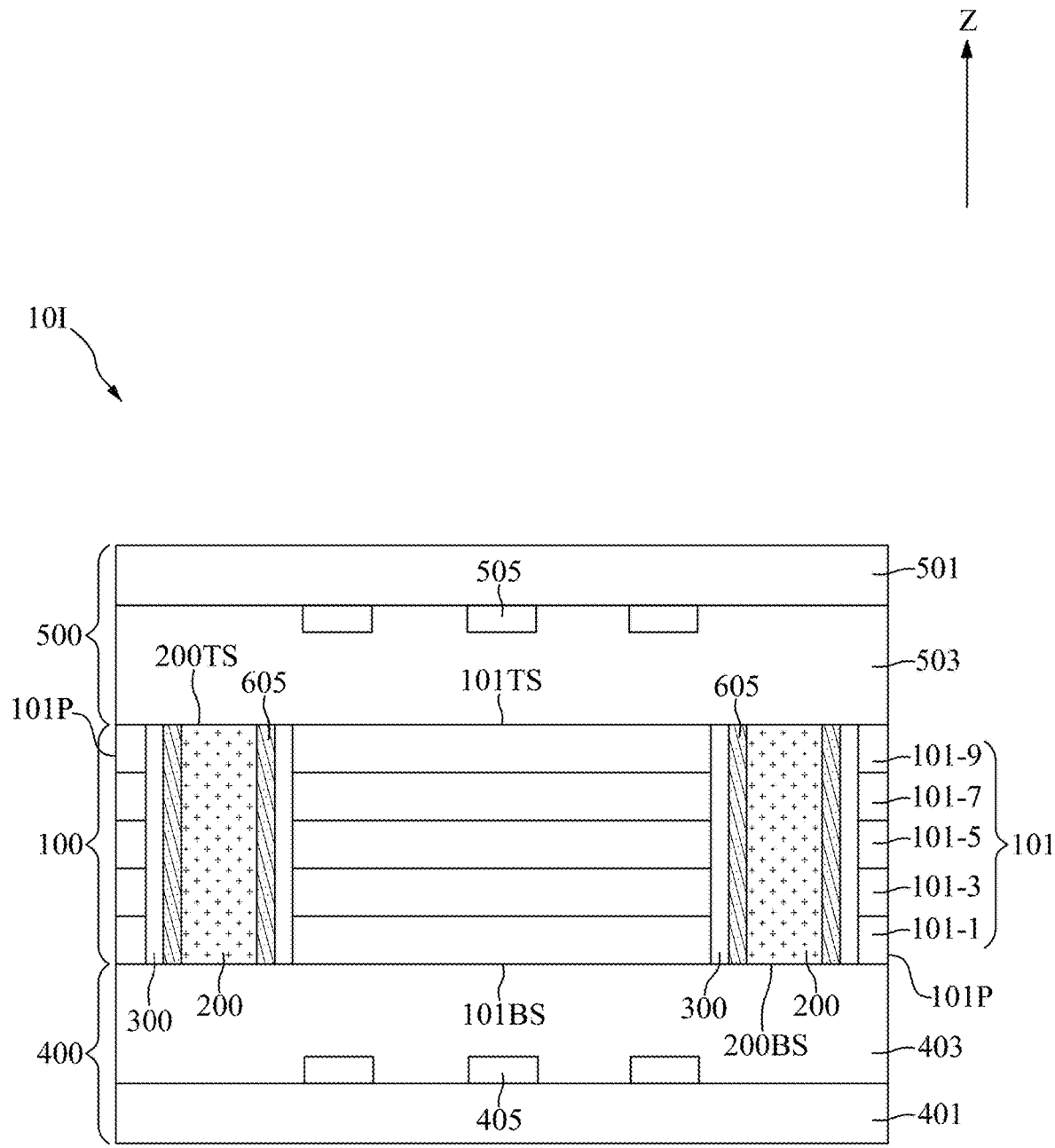

With reference to FIG. 10, in the semiconductor device 10I, the plurality of porous spacers 605 may be disposed between the plurality of air gaps 300 and the first protection structure 200. In other words, the plurality of porous spacers 605 may be disposed on sides of the first protection structure 200 and the plurality of air gaps 300 may be disposed on sides of the plurality of porous spacers 605. The plurality of porous spacers 605 may provide structural support for the first protection structure 200 and the plurality of air gaps 300 may keep alleviating the parasitic capacitance of the first protection structure 200. In addition, the plurality of porous spacers 605 may prevent the first gate conductive layer 207 from flaking or spalling to the plurality of air gaps 300 during subsequent semiconductor processes.

Figure 11:
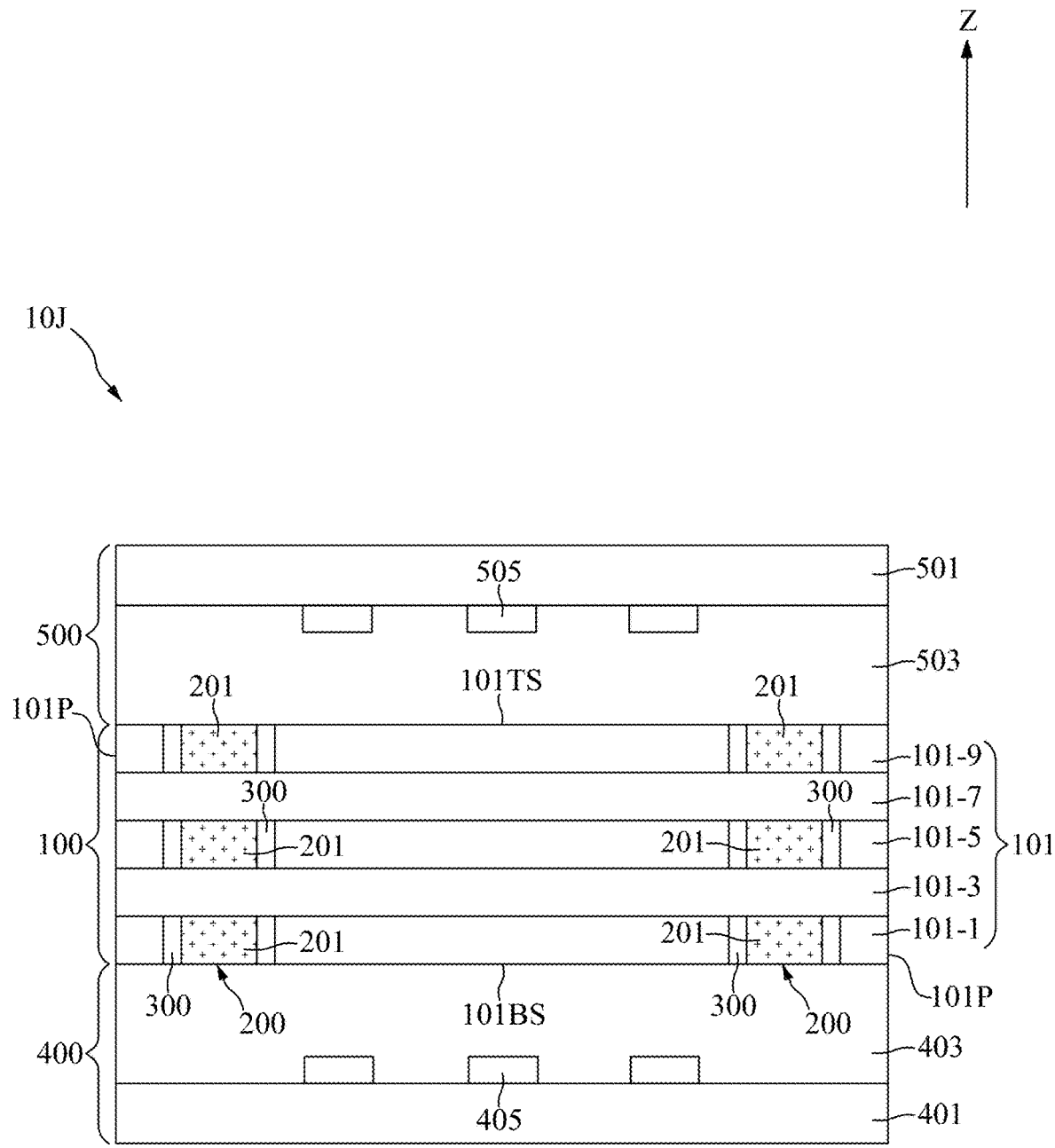

With reference to FIG. 11, in the semiconductor device 10J, the first protection structure 200 may include a plurality of pad portions 201. In a cross-sectional perspective, the plurality of pad portions 201 may be arranged vertically and separate from each other. For example, the plurality of pad portions 201 may be only disposed in the sub-layers 101-1, 101-5, 101-9. For another example, the plurality of pad portions 201 may be disposed in the sub-layers 101-3, 101-7. The plurality of air gaps 300 may be disposed on the sides of the plurality of pad portions 201.

Figure 12:
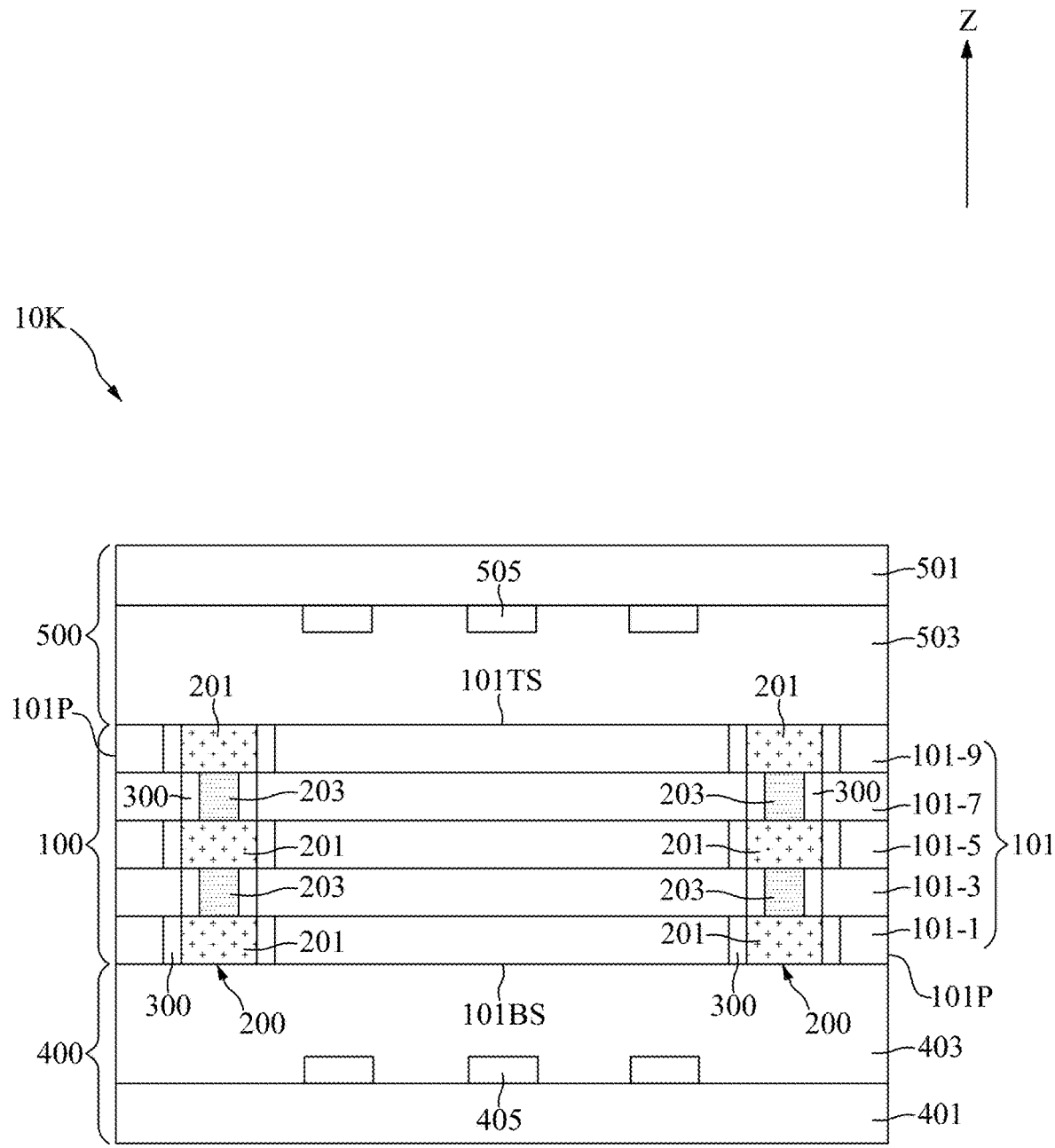

With reference to FIG. 12, in the semiconductor device 10K, the first protection structure 200 may include a plurality of pad portions 201 and a plurality of via portions 203. In a cross-sectional perspective, the plurality of pad portions 201 may be arranged vertically and separate from each other. The plurality of via portions 203 may be respectively correspondingly disposed between adjacent pairs of the plurality of pad portions 201. Each of the plurality of via portions 203 may concurrently contact corresponding two of the plurality of pad portions 201. A width of the plurality of pad portions 201 may be greater than a width of the plurality of via portions 203. The plurality of air gaps 300 may be disposed on the sides of the plurality of pad portions 201 and the sides of the plurality of via portions 203.

Figure 13:
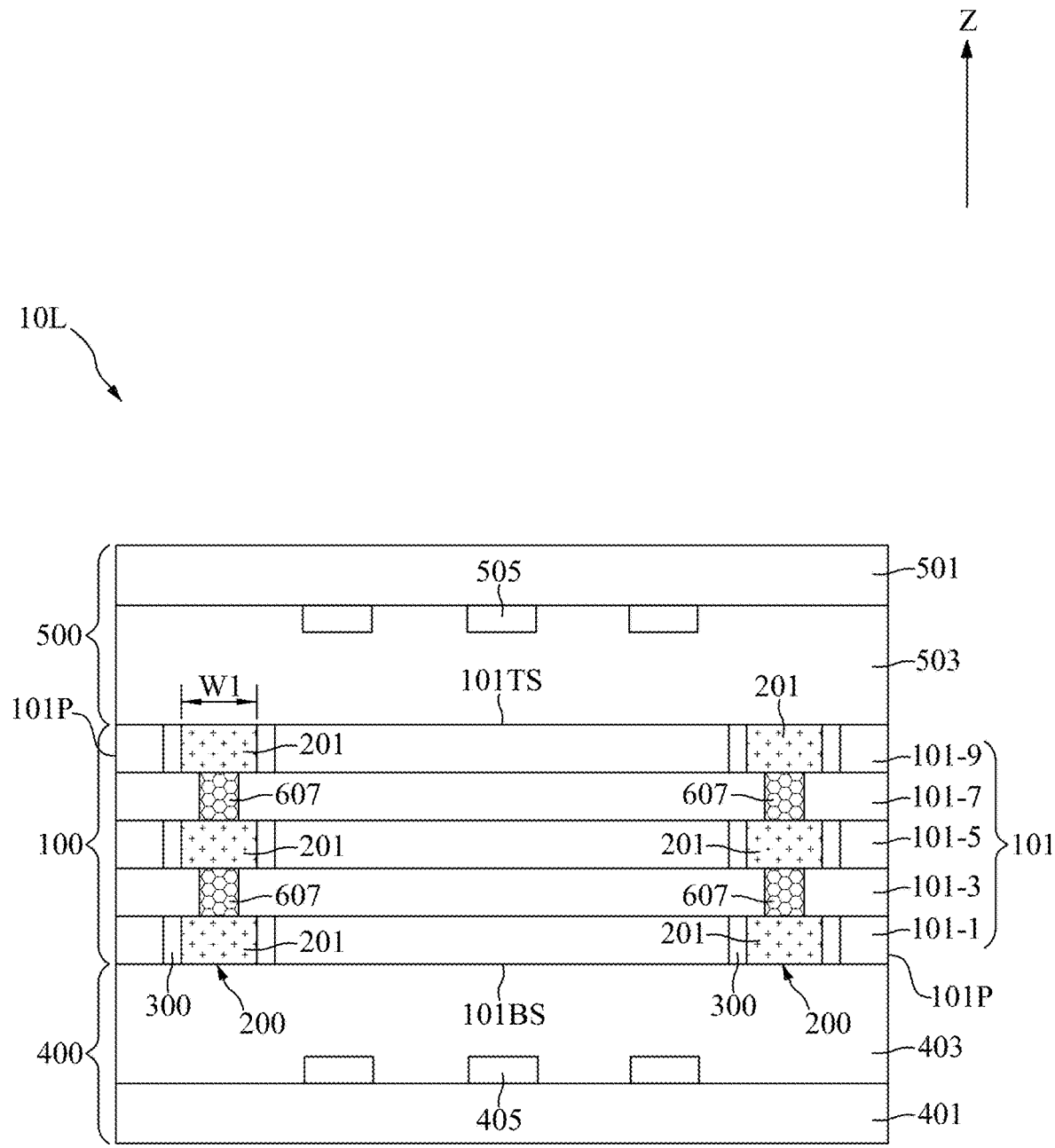

With reference to FIG. 13, in the semiconductor device 10L, the first protection structure 200 may include a plurality of pad portions 201 and a plurality of porous layer 607. In a cross-sectional perspective, the plurality of pad portions 201 may be arranged vertically and separate from each other. The plurality of porous layer 607 may be respectively correspondingly disposed between adjacent pairs of the plurality of pad portions 201. Each of the plurality of porous layer 607 may concurrently contact corresponding two of the plurality of pad portions 201. A width of the plurality of pad portions 201 may be greater than a width of the plurality of porous layer 607. The plurality of air gaps 300 may be only disposed on the sides of the plurality of pad portions 201. The plurality of porous layer 607 may have a porosity between about 10% and about 50%. The plurality of porous layer 607 may have a structure similar to the plurality of porous spacers 605 illustrated in FIG. 9 and may provide a similar functionality.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 14:
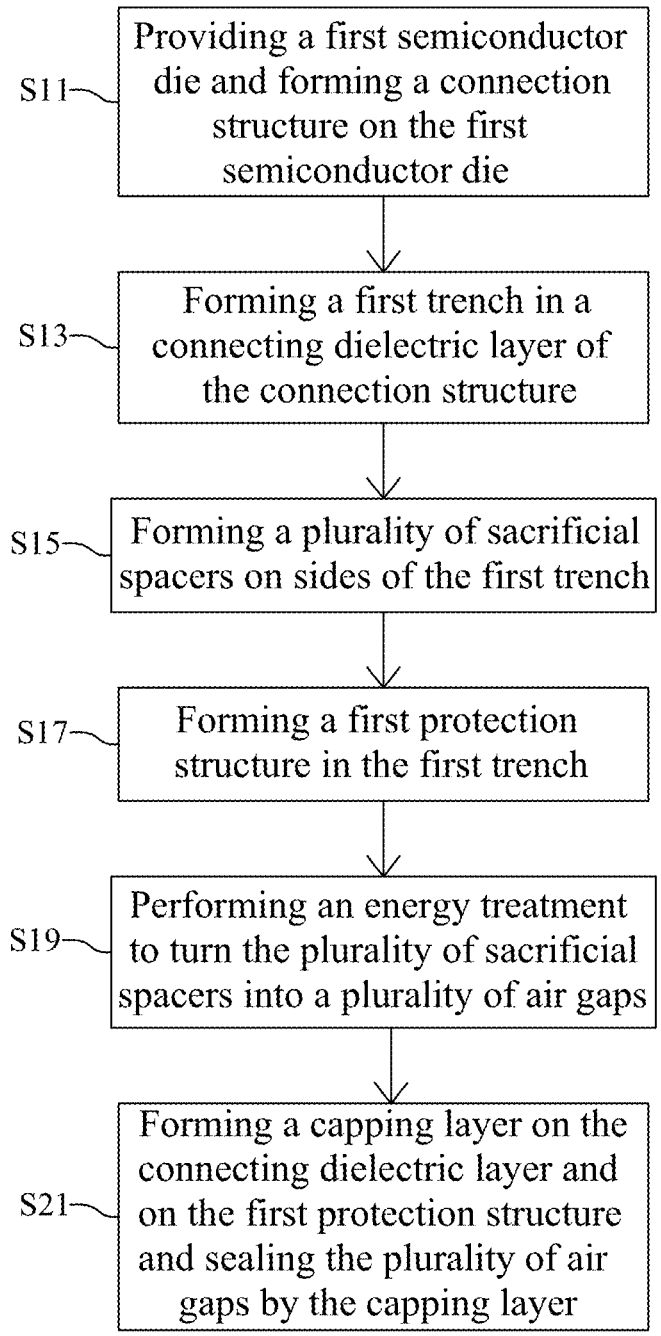
FIG. 14 illustrates, in a flowchart diagram form, a method for fabricating a semiconductor device in accordance with one embodiment of the present disclosure.
Figure 15:
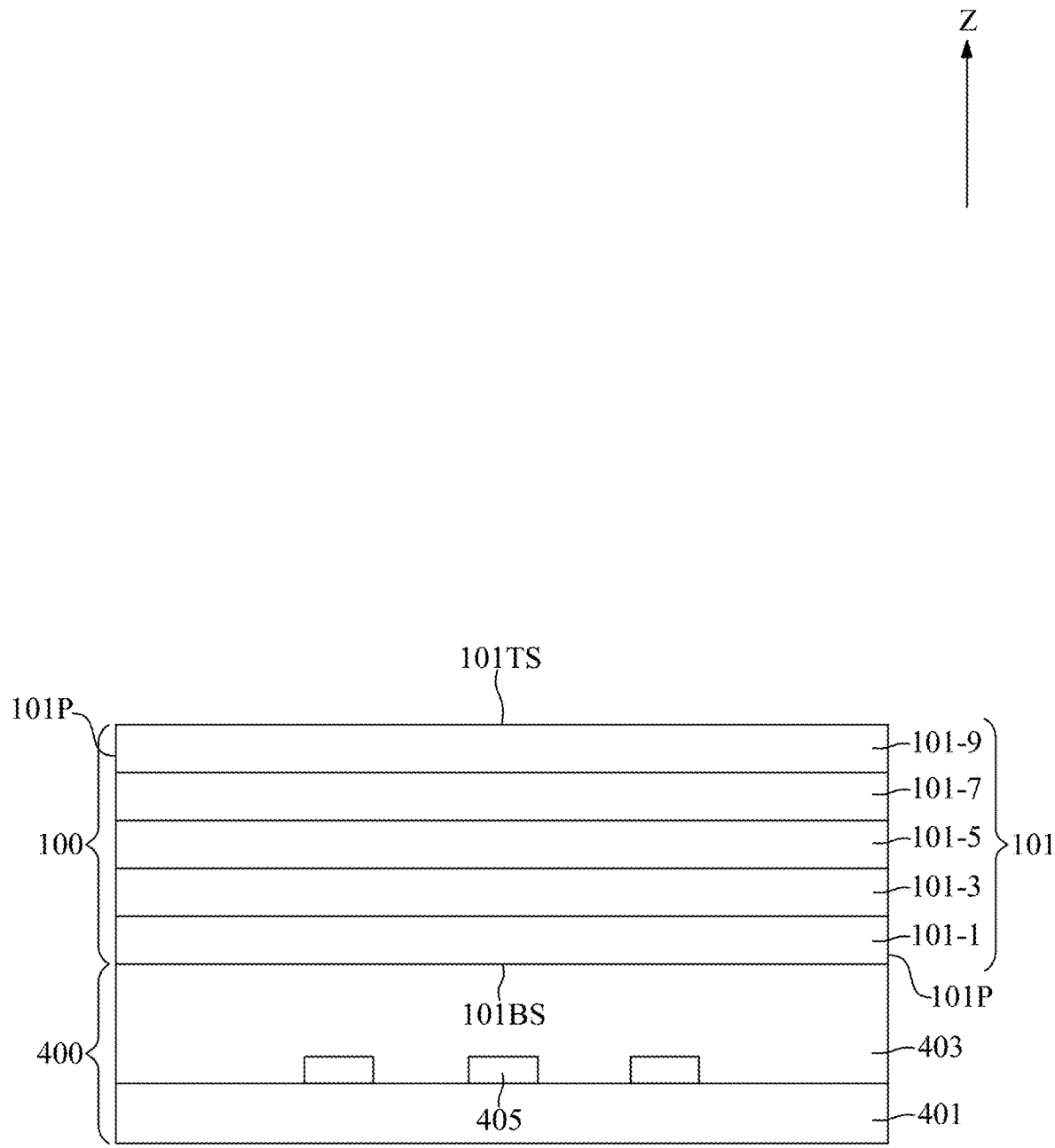
FIG. 15 is a cross-sectional view illustrating an intermediate stage of forming a first semiconductor die with a connection structure in the method shown in FIG. 1, in accordance with some embodiments.
Figure 16:
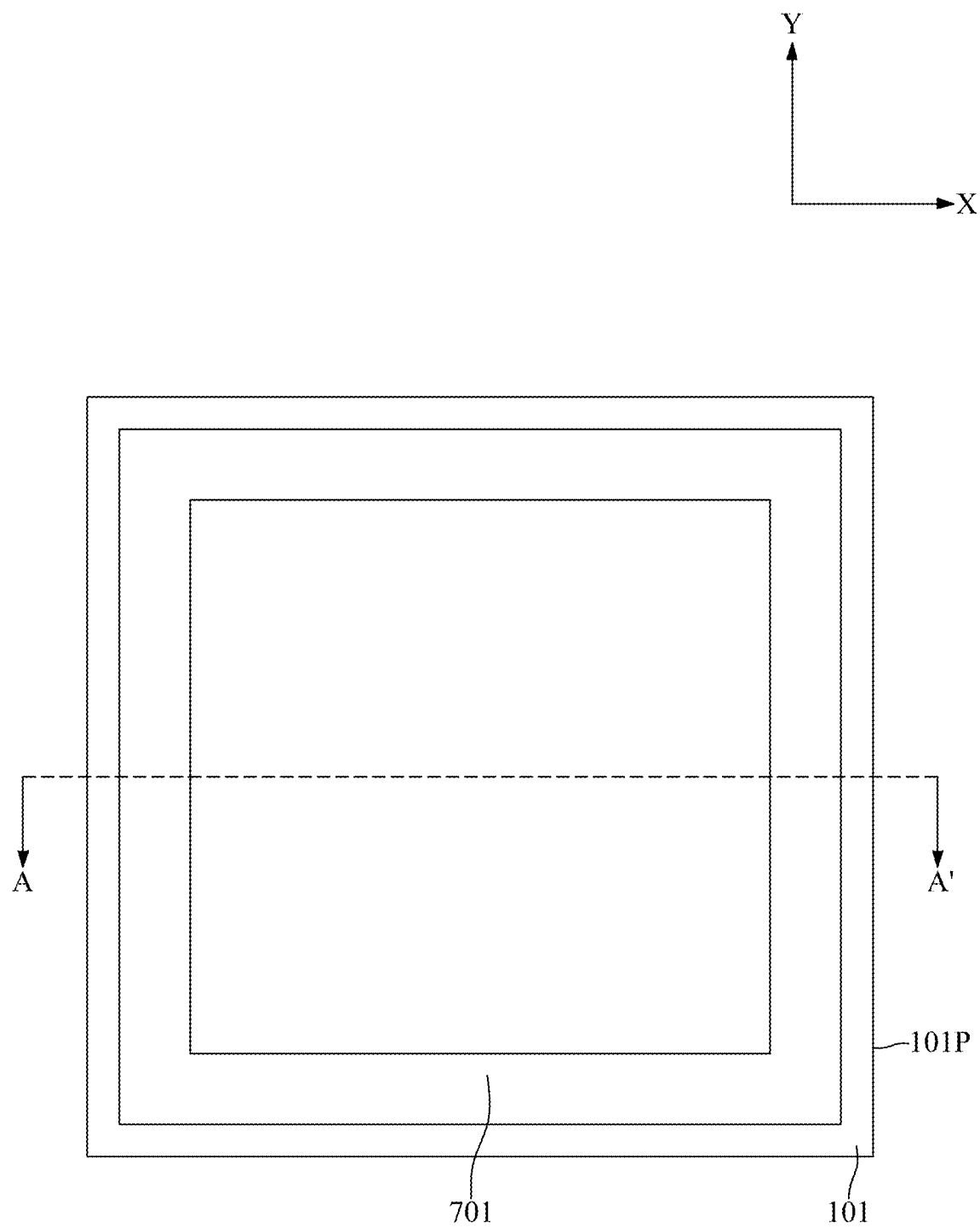
FIG. 16 illustrates, in a schematic top-view diagram, illustrating an intermediate stage of forming a trench adjacent to and parallel to the perimeter of the connection structure in the method shown in FIG. 1, in accordance with some embodiments.
Figure 17:
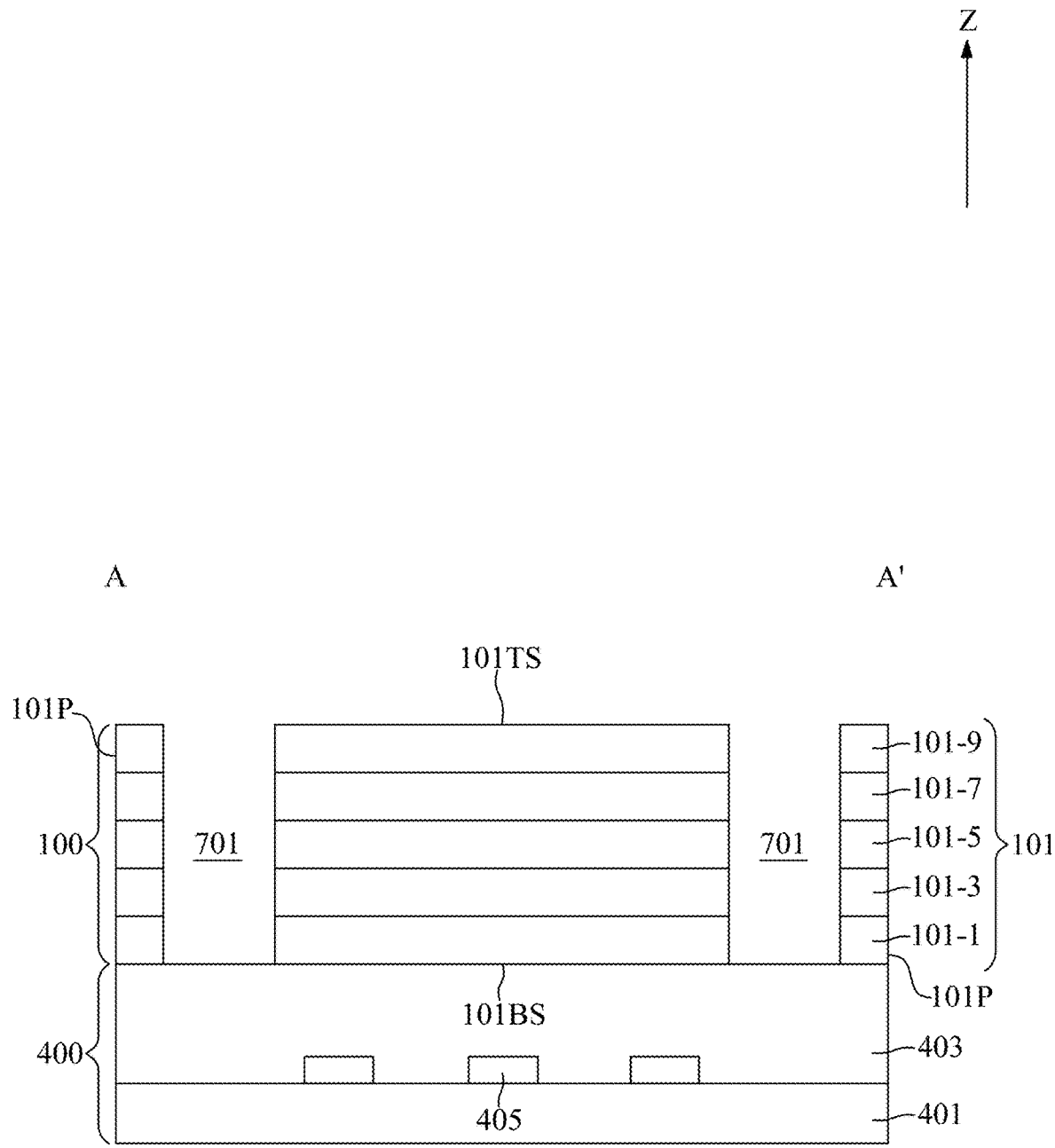
FIG. 17 is a schematic cross-sectional view diagram taken along a line A-A' in FIG. 16.

FIG. 14 illustrates, in a flowchart diagram form, a method 20 for fabricating a semiconductor device 10A in accordance with one embodiment of the present disclosure. FIG. 15 illustrates, in a schematic cross-sectional view diagram, part of a flow for fabricating the semiconductor device 10A in accordance with one embodiment of the present disclosure. FIG. 16 illustrates, in a schematic top-view diagram, part of the flow for fabricating the semiconductor device 10A in accordance with one embodiment of the present disclosure. FIG. 17 is a schematic cross-sectional view diagram taken along a line A-A' in FIG. 16. FIGS. 18 to 22 illustrate, in schematic cross-sectional view diagrams, part of the flow for fabricating the semiconductor device 10A in accordance with one embodiment of the present disclosure.

With reference to FIGS. 14 and 15, at step S11, a first semiconductor die 400 may be provided and a connection structure 100 may be formed on the first semiconductor die 400.

With reference to FIG. 15, the connection structure 100 may include a connecting dielectric layer 101 and a plurality of connection conductive layer (Not shown in FIG. 15 for clarity). The connecting dielectric layer 101 may include a plurality of sub-layers 101-1, 101-3, 101-5, 101-7, 101-9 sequentially formed on the first semiconductor die 400. The plurality of connection conductive layer may be formed among the connecting dielectric layer 101.

With reference to FIGS. 14, 16, and 17, at step S13, a first trench 701 may be formed in the connecting dielectric layer 101.

With reference to FIGS. 16 and 17, in a top-view perspective, the first trench 701 may be formed adjacent to and parallel to the perimeter 101P of the connecting dielectric layer 101. In a cross-sectional perspective, the first trench 701 may be formed so as to penetrate the connecting dielectric layer 101. Portions of the top surface of the first semiconductor die 400 may be exposed through the first trench 701.

Figure 18:
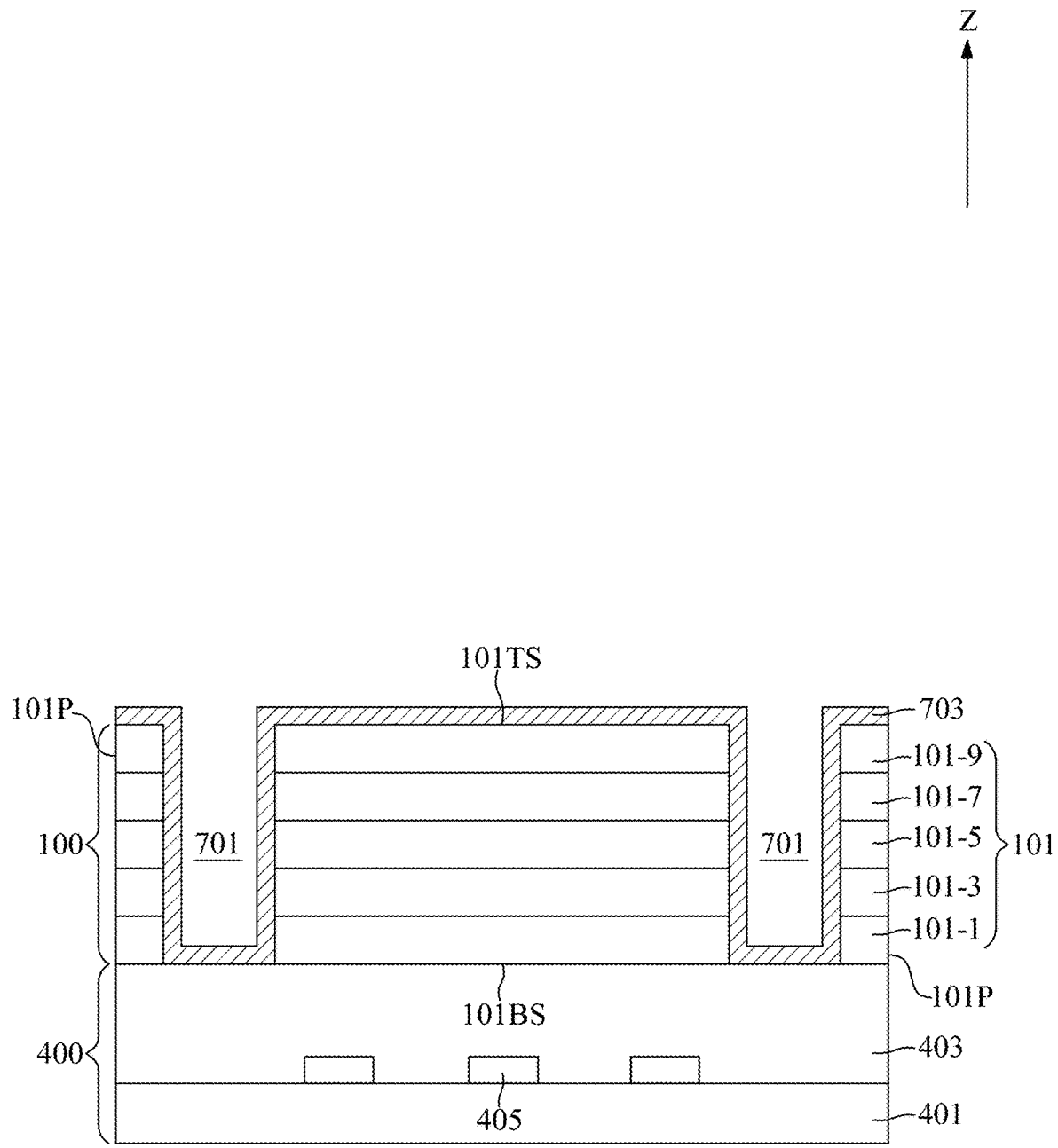
FIGS. 18 to 22 illustrate, in schematic cross-sectional view diagrams, illustrating an intermediate stage of forming a first protection structure and air gaps in the method shown in FIG. 1, in accordance with some embodiments.
Figure 19:
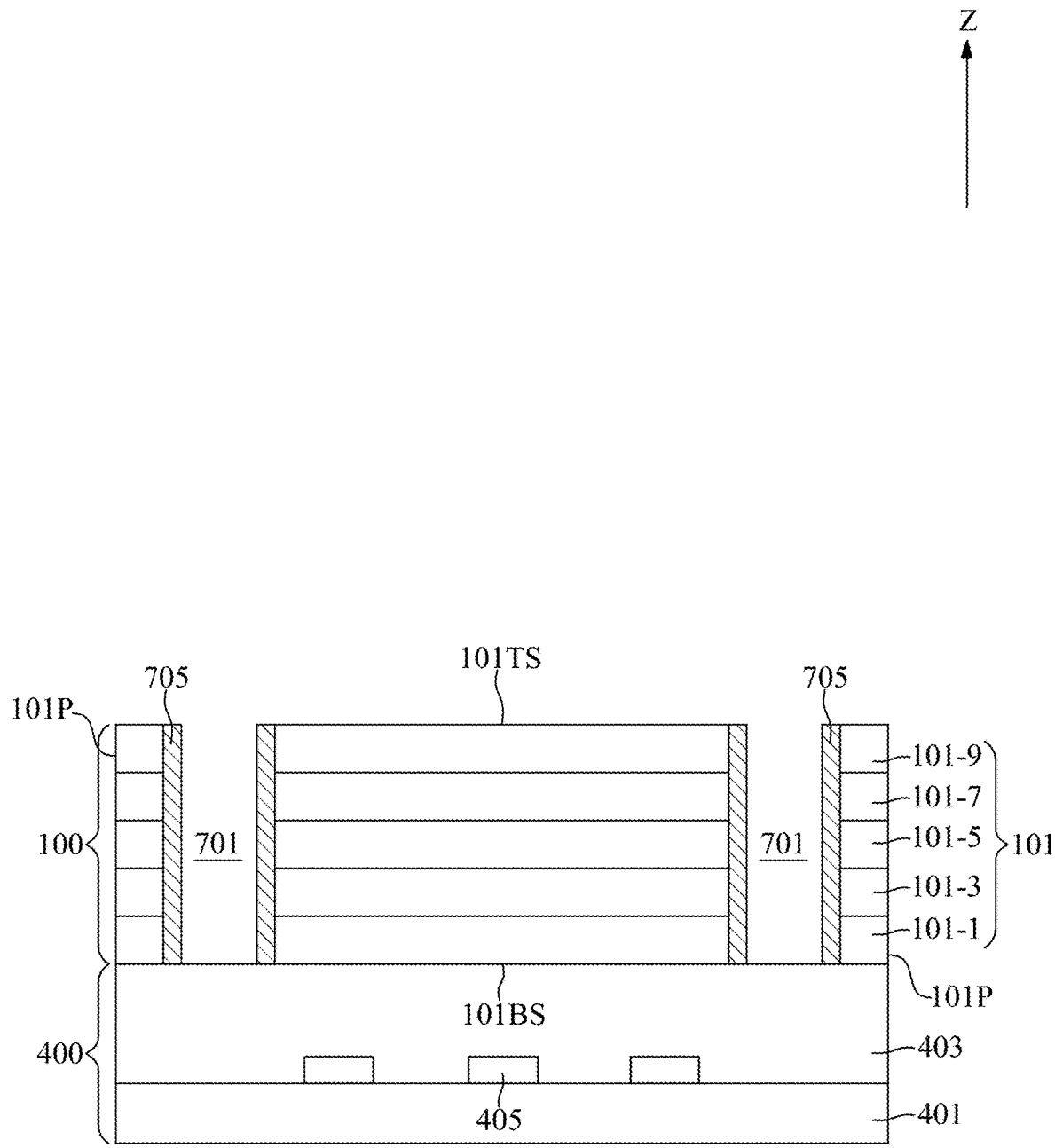

With reference to FIGS. 14, 18, and 19, at step S15, a plurality of sacrificial spacers 705 may be formed on sides of the first trench 701.

With reference to FIG. 18, a layer of energy-removable material 703 may be formed on the top surface 101TS of the connecting dielectric layer 101 and in the first trench 701. The energy-removable material 703 may be, for example, a thermal decomposable material, a thermal degradable material, a photonic decomposable material, an e-beam decomposable material, or a combination thereof. The thermal decomposable material or the thermal degradable material decomposes or degrades into a gaseous state when exposed to a temperature exceeding the decomposition temperature of the thermal decomposable material or the degradation temperature of the thermal degradable material. The photonic decomposable material or the e-beam decomposable material decomposes into a gaseous state when exposed to an energy exceeding the bonding energy of the photonic decomposable material or the e-beam decomposable material.

With reference to FIG. 19, an etch process, such as an anisotropic dry etch process, may be performed to remove the layer of energy-removable material 703 formed on the top surface 101TS of the connecting dielectric layer 101 and on the bottom surface of the first trench 701 and concurrently form the plurality of sacrificial spacers 705.

Figure 20:
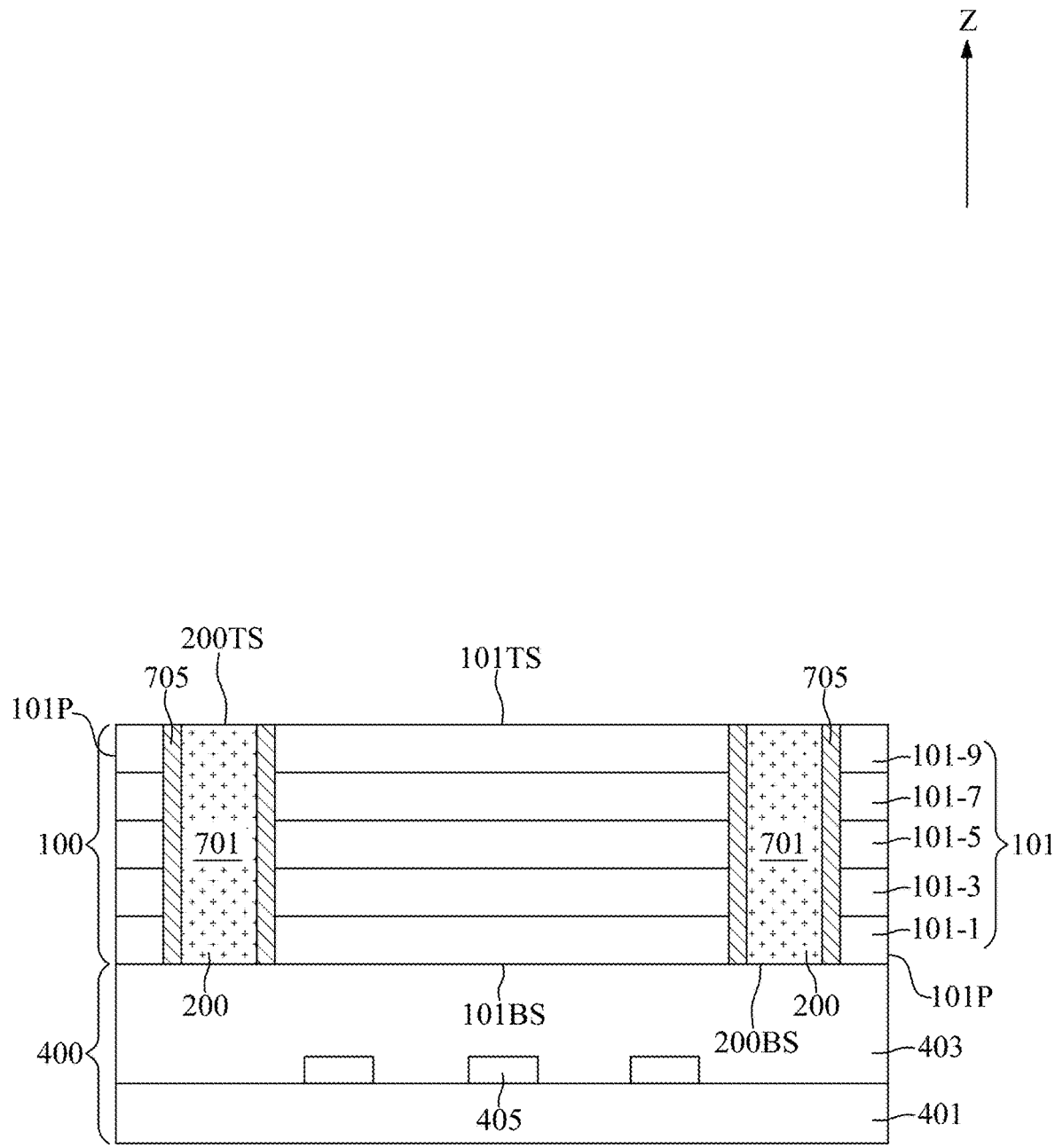

With reference to FIGS. 14 and 20, at step S17, a first protection structure 200 may be formed in the first trench 701. A conductive material such as copper, aluminum, titanium, tungsten, or cobalt may be deposited into the first trench 701 by a deposition process. After the deposition process, a planarization process, such as chemical mechanical polishing, may be performed to remove excess material, provide a substantially flat surface for subsequent processing steps, and conformally form the first protection structure 200.

Figure 21:
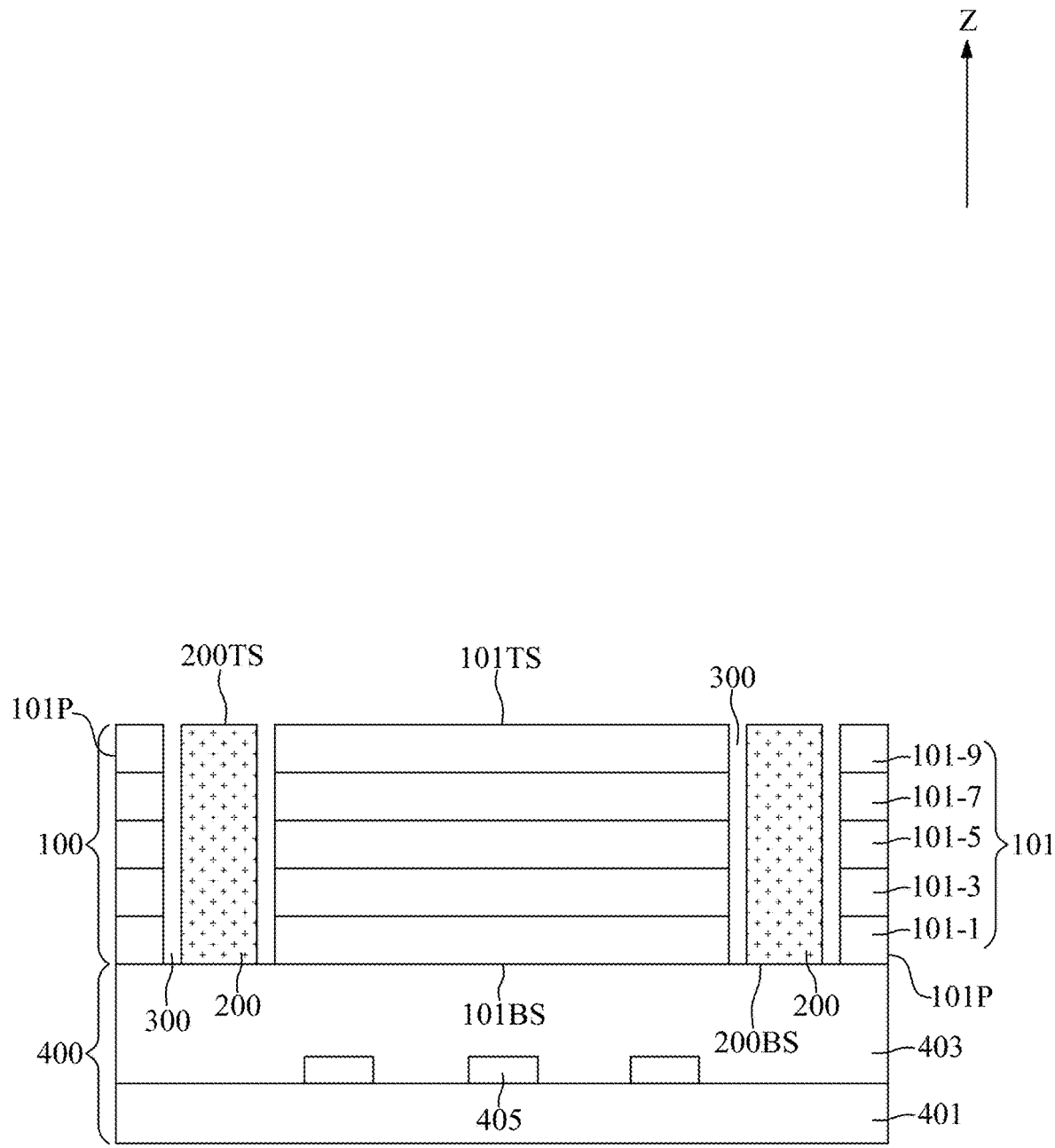

With reference to FIGS. 14 and 21, at step S19, an energy treatment may be performed to turn the plurality of sacrificial spacers 705 into a plurality of air gaps 300. The energy source of the energy treatment may include heat, light, or a combination thereof. When heat is used as the energy source, a temperature of the energy treatment may be between about 800° C. and about 900° C. When light is used as the energy source, an ultraviolet light or an e-beam may be applied.

Figure 22:
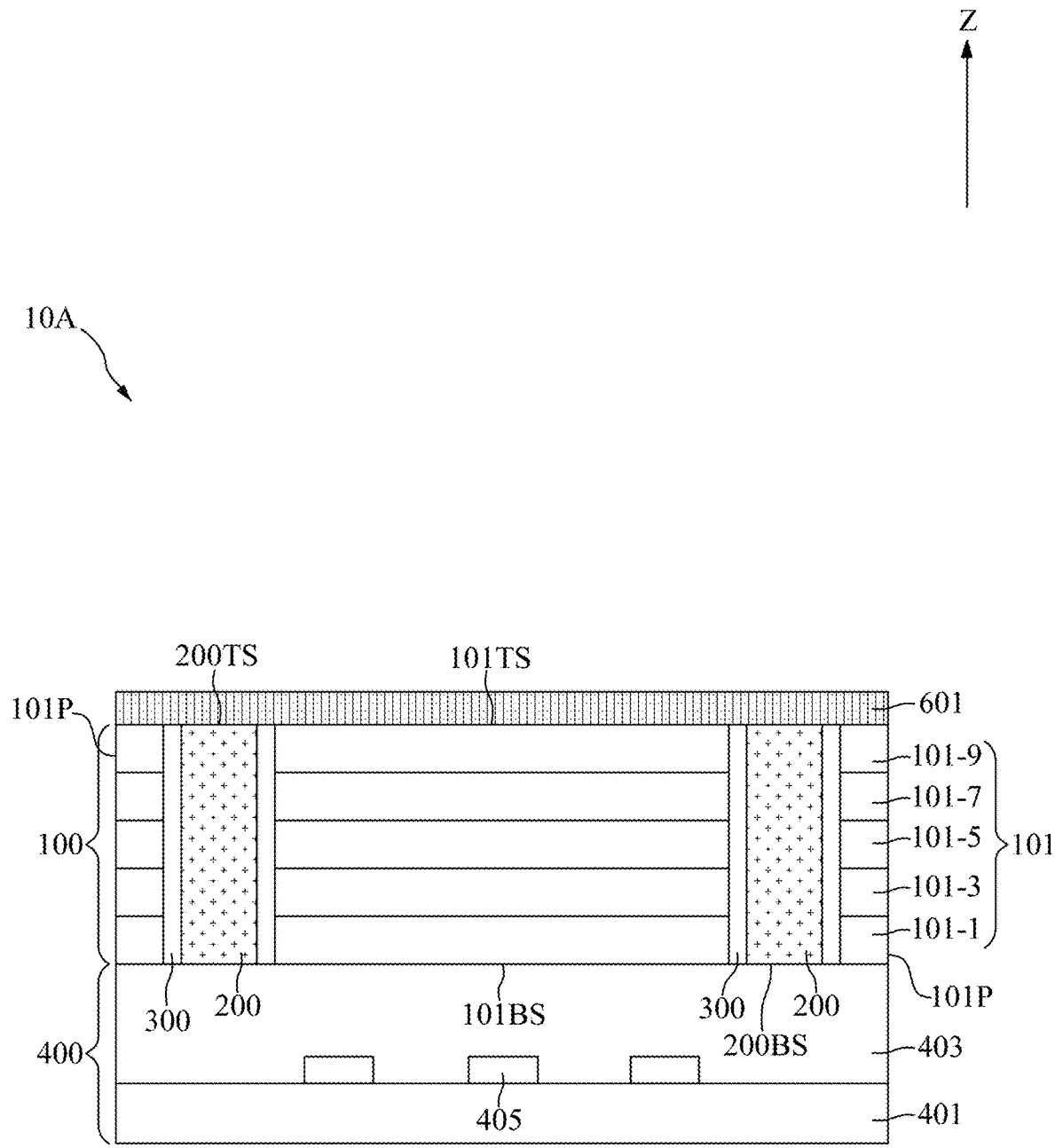

With reference to FIGS. 14 and 22, at step S21, a capping layer 601 may be formed on the connecting dielectric layer 101 and on the first protection structure 200 and the capping layer 601 may seal the plurality of air gaps 300. The capping layer 601 may be a non-gap filling material such as silicon oxide formed using TEOS, fluorine-doped silicon oxide formed using fluorinated-TEOS, organic spin-on glass, or the like. The capping layer 601 may be formed by chemical vapor deposition, high density plasma, spin-on, or the like. The parameters that determine if a material is non-gap filling depends on the method used to deposit the material and the width and depth of the spaces in which the air gaps are formed. For example, if chemical vapor deposition is used, the step coverage of the material determines whether the material will form an air gap. For example, a more conformal material, will make smaller air gaps or tend not to form air gaps at all. For spin-on materials, viscosity and surface properties affect the formation of an air gap. Surface energy interactions between materials may also impact air gap formation, especially for materials that are spun-on.

Figure 23:
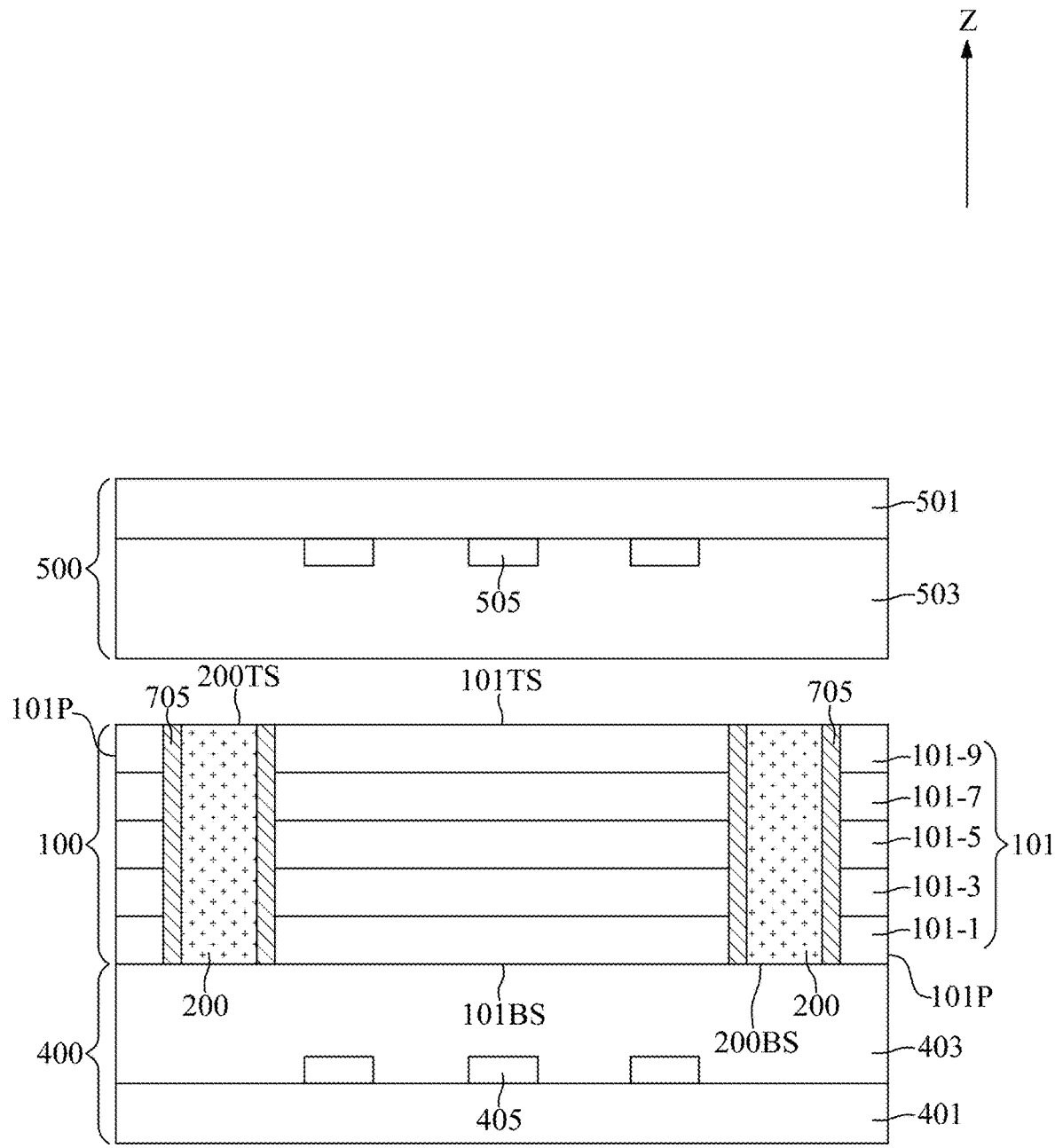
FIGS. 23 and 24 illustrate, in schematic cross-sectional view diagrams, part of a flow for fabricating a semiconductor device in accordance with one embodiment of the present disclosure.
Figure 24:
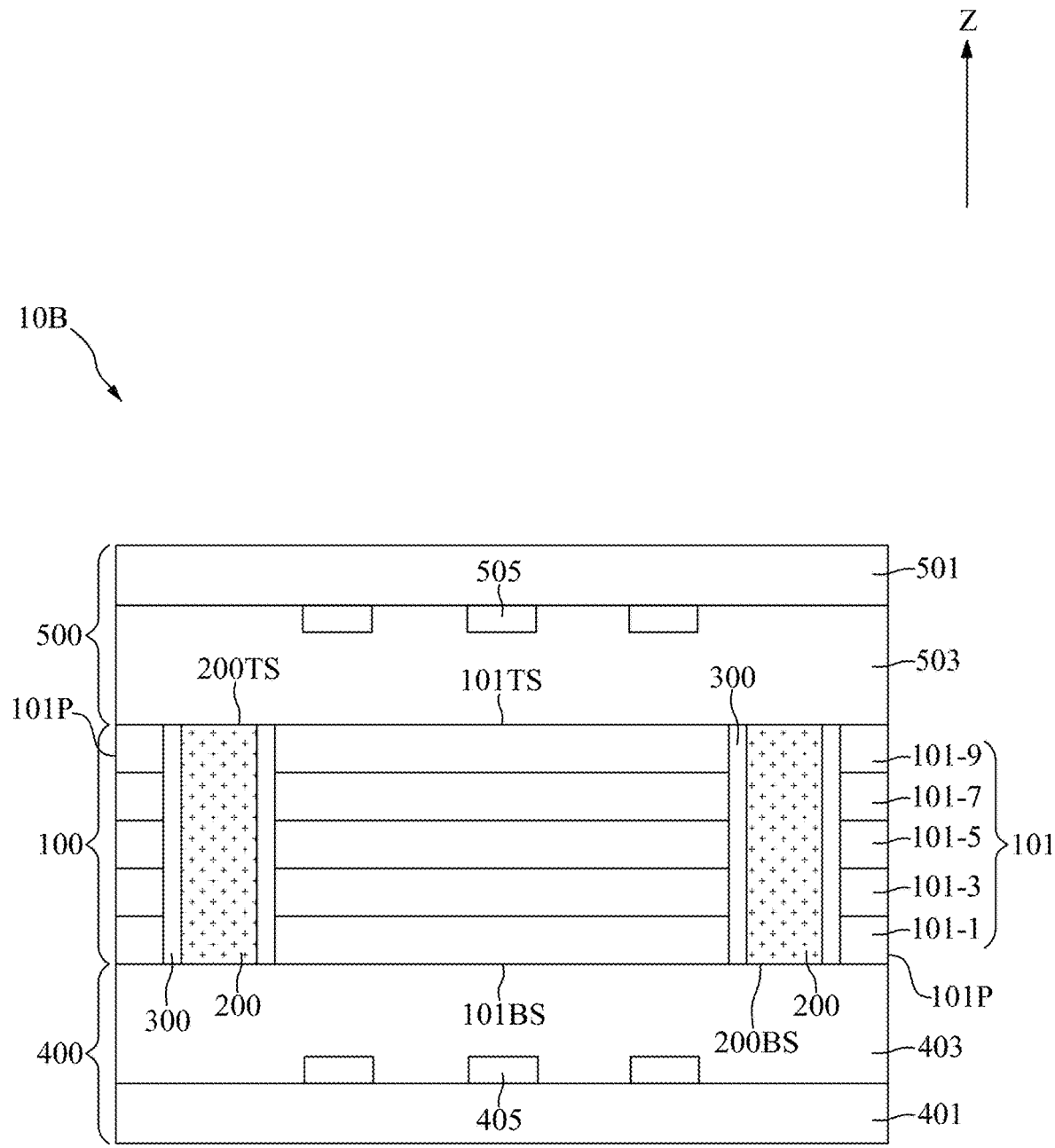

FIGS. 23 and 24 illustrate, in schematic cross-sectional view diagrams, part of a flow for fabricating the semiconductor device 10B in accordance with one embodiment of the present disclosure.

With reference to FIGS. 23 and 24, in the embodiment depicted, a second semiconductor die 500 may be bonded to the connection structure 100 through a bonding process. The second semiconductor die 500 may be placed in an upside-down manner. Subsequently, the upside-down second semiconductor die 500 may be placed on the top surface 101TS of the connecting dielectric layer 101. A thermal treatment may be performed to achieve a hybrid bonding between elements of the second semiconductor die 500 and the connection structure 100 for the bonding process. The hybrid bonding may include an oxide-to-oxide bonding and a metal-to-metal bonding. The oxide-to-oxide bonding may originate from the bonding between the second dielectric layer 503 of the second semiconductor die 500 and the connecting dielectric layer 101. The metal-to-metal bonding may originate from the bonding between the plurality of second conductive features (Not shown in FIG. 23 for clarity) of the second semiconductor die 500 and the connection conductive layer of the connection structure 100. In some embodiments, a temperature of bonding process may be between about 300° C. and about 450° C. An energy treatment similar with that illustrated in FIG. 21 may be performed to turn the plurality of sacrificial spacers 705 into the plurality of air gaps 300.

A thinning process may be optionally performed on a second substrate 501 of the second semiconductor die 500 using an etching process, a chemical polishing process, or a grinding process to reduce a thickness of the second substrate 501.

In some embodiments, the energy treatment may be performed concurrently with the bonding process of the second semiconductor die 500 by providing a temperature between about 800° C. and about 900° C. for the bonding process. As a result, the complexity of fabrication of the semiconductor device 10B may be reduced and a fabrication cost of the semiconductor device 10B may be also reduced.

Figure 25:
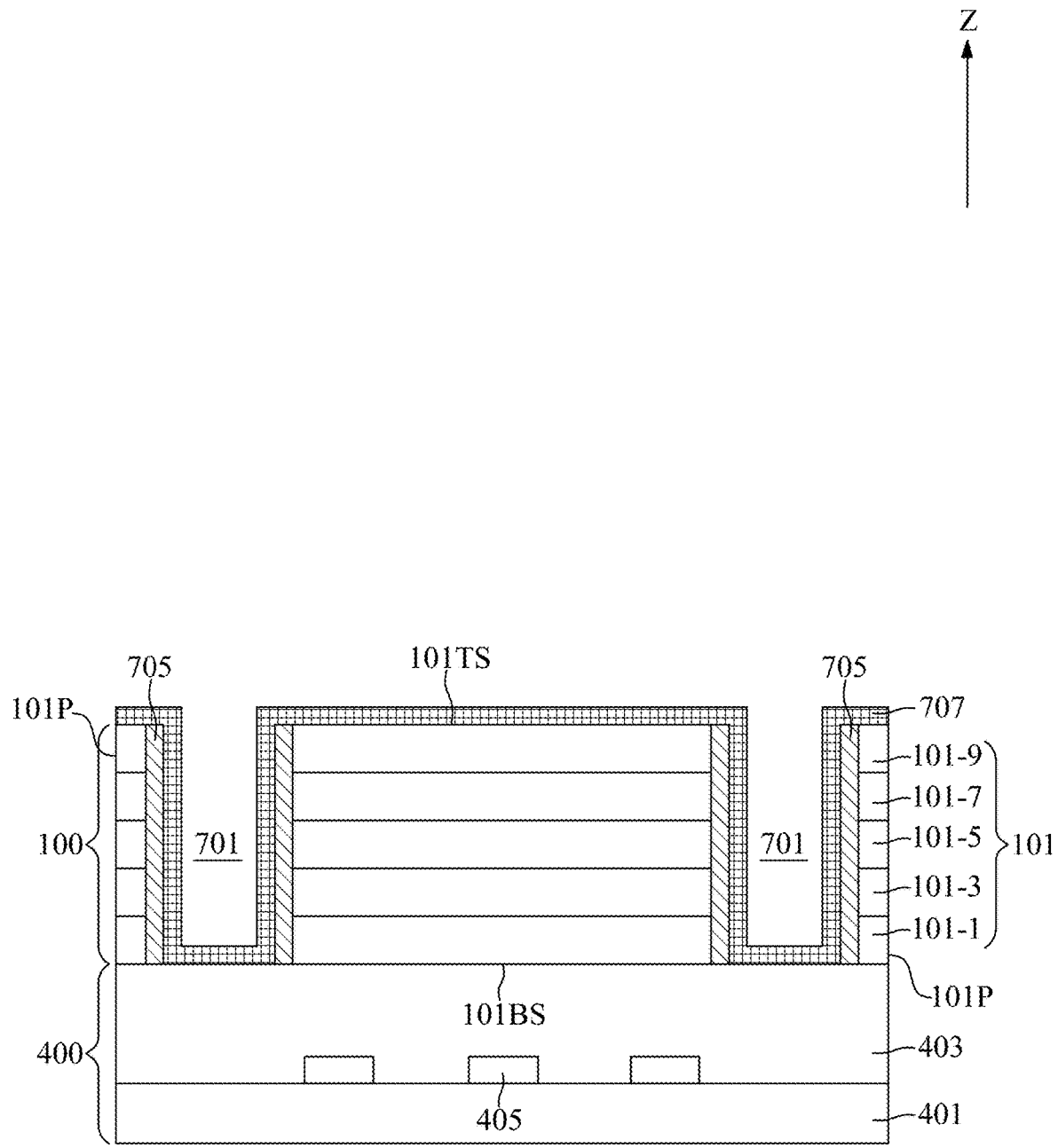
FIGS. 25 to 27 illustrate, in schematic cross-sectional view diagrams, part of a flow for fabricating a semiconductor device in accordance with one embodiment of the present disclosure.
Figure 26:
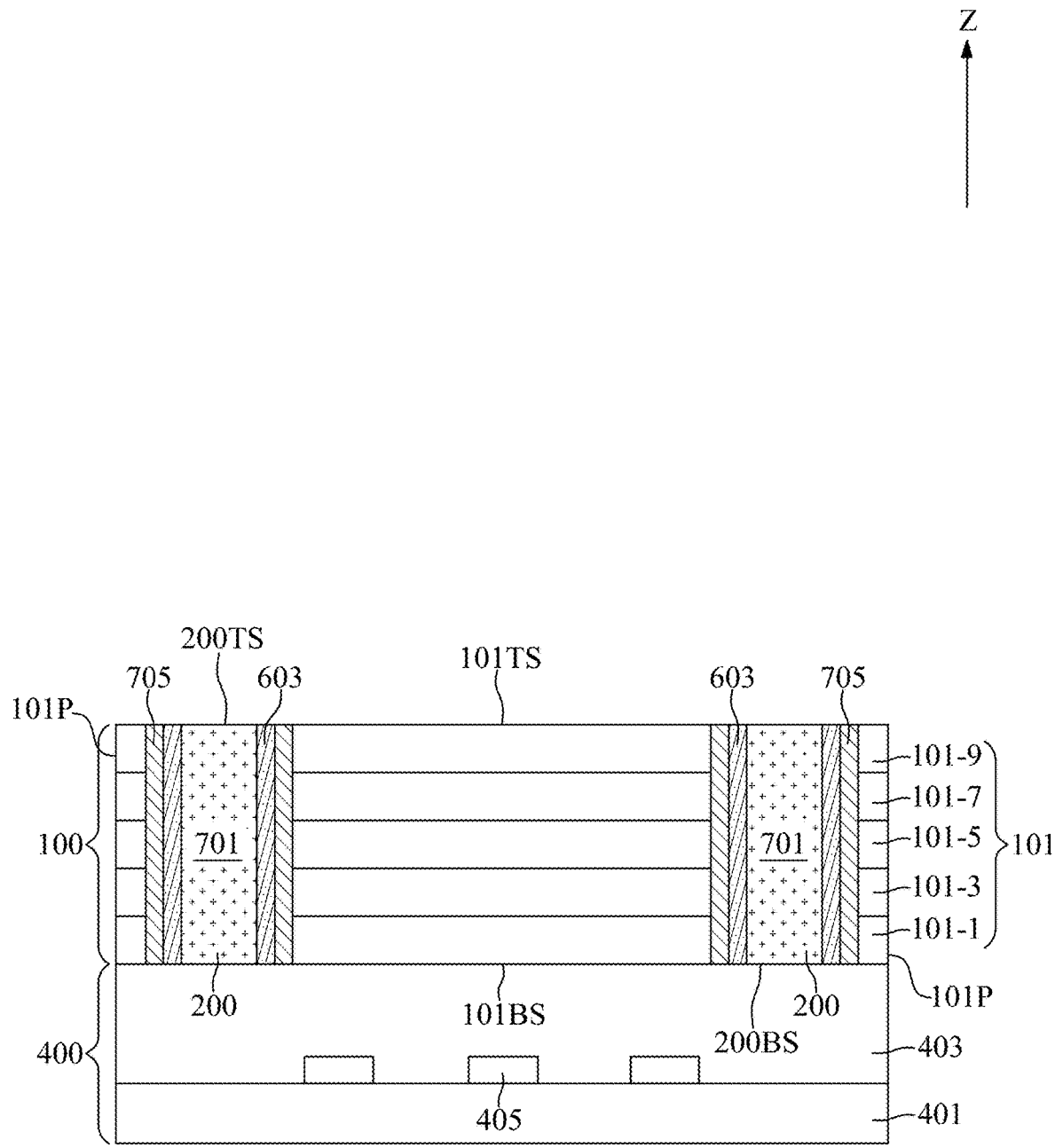
Figure 27:
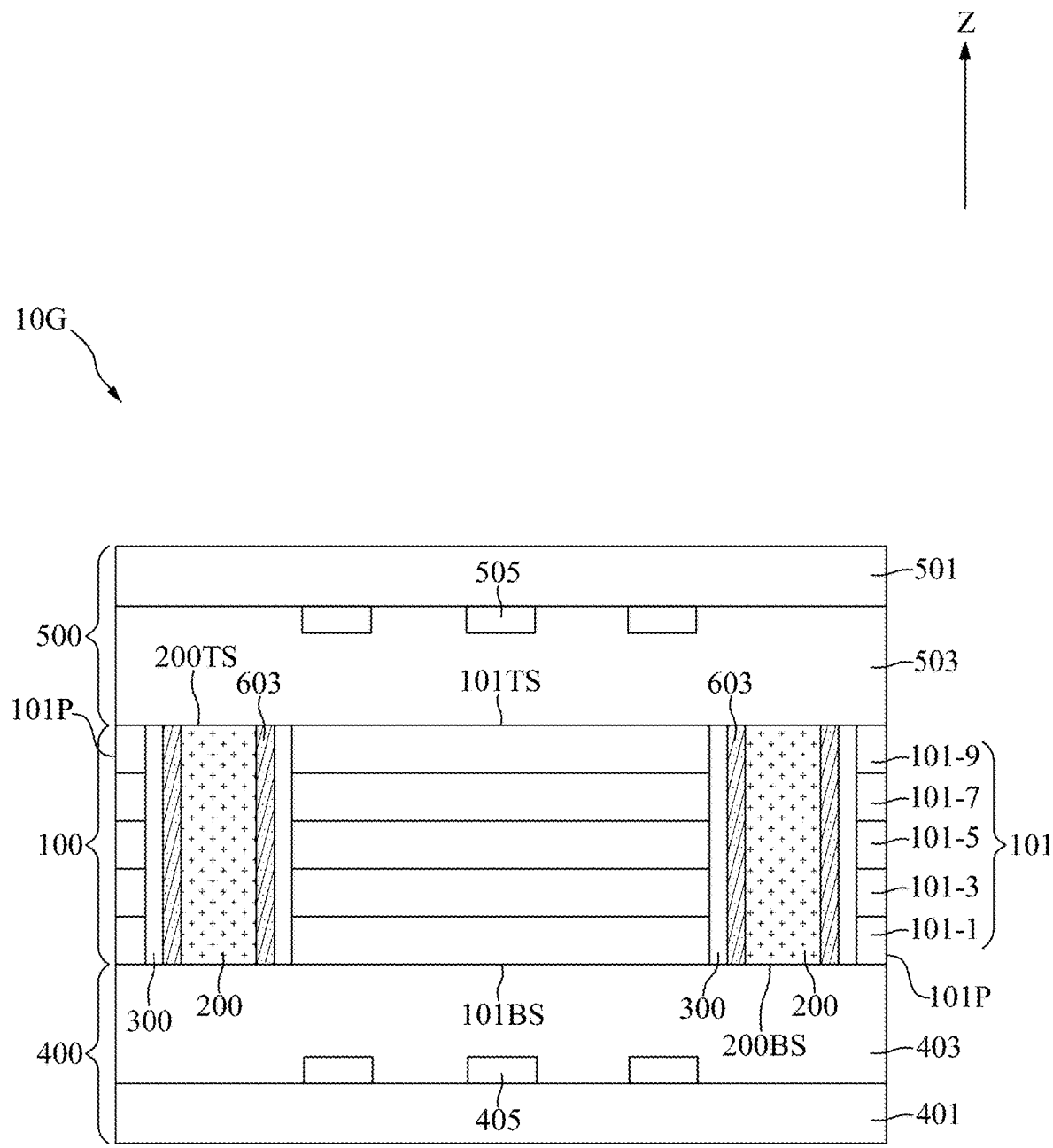

FIGS. 25 to 27 illustrate, in schematic cross-sectional view diagrams, part of a flow for fabricating the semiconductor device 10G in accordance with one embodiment of the present disclosure.

With reference to FIG. 25, an intermediate semiconductor device may be fabricated by a procedure similar to that illustrated in FIGS. 15 to 19. Subsequently, a layer of ferromagnetic material 707 may be formed on the top surface 101TS of the connecting dielectric layer 101 and in the first trench 701. The ferromagnetic material 707 may be, for example, manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

With reference to FIG. 26, an etch process, such as an anisotropic dry etch process, may be performed to remove the layer of ferromagnetic material 707 formed on the top surface 101TS of the connecting dielectric layer 101 and on the bottom surface of the first trench 701 and concurrently form the plurality of ferromagnetic spacers 603. The first protection structure 200 may be formed in the first trench 701 with a procedure similar with that illustrated in FIG. 20. With reference to FIG. 27, the plurality of air gaps 300 and the second semiconductor die 500 may be formed with a procedure similar with that illustrated in FIGS. 23 and 24.

One aspect of the present disclosure provides a semiconductor device including a connection structure including a connecting dielectric layer, a first protection structure positioned in the connecting dielectric layer and positioned adjacent to a perimeter of the connecting dielectric layer, and a plurality of air gaps positioned on sides of the first protection structure. The first protection structure is formed of copper, aluminum, titanium, tungsten, cobalt, the like, or a combination thereof.

Another aspect of the present disclosure provides a method for fabricating a semiconductor device including providing a first semiconductor die, forming a connecting dielectric layer above the first semiconductor die, forming a first trench in the connecting dielectric layer, forming a plurality of sacrificial spacers on sides of the first trench, forming a first protection structure in the first trench, and performing an energy treatment to turn the plurality of sacrificial spacers into a plurality of air gaps. The plurality of sacrificial spacers are formed of an energy-removable material and the first protection structure is formed of copper, aluminum, titanium, tungsten, cobalt, the like, or a combination thereof.

Due to the design of the semiconductor device of the present disclosure, the first protection structure 200 may suppress electromagnetic interference and the plurality of air gaps 300 may reduce the parasitic capacitance of the first protection structure 200. As a result, the performance of the semiconductor device 10A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
    a connection structure comprising a connecting dielectric layer;
    a first protection structure positioned in the connecting dielectric layer and extended along and adjacent to a horizontal perimeter of the connecting dielectric layer, wherein the connecting dielectric layer includes an inner area entirely surrounded by the first protection structure; and
    a plurality of air gaps positioned on sides of the first protection structure, each of the plurality of air gaps entirely surrounds the inner area of the connecting dielectric layer;
    wherein the first protection structure is formed of copper, aluminum, titanium, tungsten, cobalt, the like, or a combination thereof.

2. The semiconductor device of claim 1, wherein a top surface of the first protection structure and a top surface of the connecting dielectric layer are coplanar and a bottom surface of the first protection structure and a bottom surface of the connecting dielectric layer are coplanar.

3. The semiconductor device of claim 2, further comprising a first semiconductor die and a second semiconductor die, wherein the first semiconductor die is positioned below the connecting dielectric layer, the second semiconductor die is positioned on the connecting dielectric layer and on the first protection structure, and the second semiconductor die seals the plurality of air gaps.

4. The semiconductor device of claim 1, further comprising a plurality of ferromagnetic spacers positioned between the first protection structure and the plurality of air gaps, wherein the plurality of ferromagnetic spacers are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

* * * * *